(12) United States Patent
Kang

(10) Patent No.: US 11,699,679 B2
(45) Date of Patent: Jul. 11, 2023

(54) SEMICONDUCTOR PACKAGE

(71) Applicant: Samsung Electronics Co., Ltd., Suwon-si (KR)

(72) Inventor: Tae-Ho Kang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 30 days.

(21) Appl. No.: 17/332,315

(22) Filed: May 27, 2021

(65) Prior Publication Data
US 2022/0130797 A1 Apr. 28, 2022

(30) Foreign Application Priority Data
Oct. 23, 2020 (KR) .................. 10-2020-0138575

(51) Int. Cl.
*H01L 25/065* (2023.01)
*H01L 23/31* (2006.01)
*H01L 21/32* (2006.01)
*H01L 23/00* (2006.01)

(52) U.S. Cl.
CPC .......... *H01L 25/0652* (2013.01); *H01L 21/32* (2013.01); *H01L 23/3128* (2013.01); *H01L 24/73* (2013.01); *H01L 2224/32145* (2013.01); *H01L 2224/32225* (2013.01); *H01L 2224/73265* (2013.01); *H01L 2225/0651* (2013.01); *H01L 2225/06506* (2013.01); *H01L 2225/06562* (2013.01); *H01L 2225/06572* (2013.01)

(58) Field of Classification Search
CPC . H01L 2225/06562; H01L 2225/06572; H01L 25/0652; H01L 25/0655; H01L 25/0657
See application file for complete search history.

(56) References Cited

U.S. PATENT DOCUMENTS

| | | | |
|---|---|---|---|
| 8,952,533 B2 | 2/2015 | Mohammed et al. | |
| 9,230,942 B2 | 1/2016 | Kumar et al. | |
| 9,686,852 B2 | 6/2017 | Semmelmeyer et al. | |
| 10,204,892 B2 | 2/2019 | Lee et al. | |
| 10,224,310 B2 | 3/2019 | Liu | |
| 10,242,965 B2 | 3/2019 | Chiu et al. | |
| 10,971,479 B2 * | 4/2021 | Lee | H01L 25/0657 |

(Continued)

*Primary Examiner* — Marcos D. Pizarro
*Assistant Examiner* — William Henry Anderson
(74) *Attorney, Agent, or Firm* — Harness, Dickey & Pierce, P.L.C.

(57) ABSTRACT

A semiconductor package including a first lower stack on a substrate and including first lower semiconductor chips, a redistribution substrate on the first lower stack, a redistribution connector electrically connecting the substrate to the redistribution substrate, a first upper stack on the redistribution substrate and including first upper semiconductor chips, a first upper connector electrically connecting the redistribution substrate to the first upper stack, a second upper stack horizontally spaced apart from the first upper stack and including second upper semiconductor chips, and a second upper connector electrically connecting the redistribution substrate to the second upper stack may be provided. The redistribution connector may be on one side of the redistribution substrate. The first upper connector may be on one side of the first upper stack. The second upper connector may be on one side of the second upper stack.

20 Claims, 15 Drawing Sheets

(56) References Cited

U.S. PATENT DOCUMENTS

| | | | |
|---|---|---|---|
| 2016/0372448 A1* | 12/2016 | Yazdani | H01L 25/105 |
| 2017/0025385 A1* | 1/2017 | Song | H01L 25/18 |
| 2017/0358564 A1* | 12/2017 | Lee | H01L 25/18 |
| 2018/0026022 A1* | 1/2018 | Lee | H01L 24/48 |
| | | | 257/659 |
| 2019/0287939 A1* | 9/2019 | Takemoto | H01L 21/565 |
| 2020/0126919 A1 | 4/2020 | Kang | |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0138575 filed on Oct. 23, 2020 in the Korean Intellectual Property Office, the disclosure of which is hereby incorporated by reference in its entirety.

BACKGROUND

The present inventive concepts relate to semiconductor packages, and more particularly, to semiconductor packages including stacked semiconductor chips.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the recent development of electronic industry, the semiconductor package is variously developed to reach the goal of compact size, small weight, and/or low manufacturing cost. In addition, many kinds of semiconductor packages show up with the expansion of their application field such as high-capacity mass storage devices.

SUMMARY

Some example embodiments of the present inventive concepts provide semiconductor packages with improved electrical characteristics.

Some example embodiments of the present inventive concepts provide semiconductor packages with high integration and compact size.

Example embodiments of the present inventive concepts are not limited to the disclosed example embodiments, and other example embodiments which have not been mentioned in this disclosure will be clearly understood to those skilled in the art from the following description.

According to some example embodiments of the present inventive concepts, a semiconductor package may include a substrate, a first lower stack on the substrate, the first lower stack including a plurality of first lower semiconductor chips stacked on each other, a redistribution substrate on the first lower stack, a redistribution connector on the substrate, the redistribution connector electrically connecting the substrate to the redistribution substrate, a first upper stack on the redistribution substrate, the first upper stack including a plurality of first upper semiconductor chips stacked in a cascade formation; a first upper connector on the redistribution substrate, the first upper connector electrically connecting the redistribution substrate to the first upper stack, a second upper stack on the redistribution substrate and horizontally spaced apart from the first upper stack, the second upper stack including a plurality of second upper semiconductor chips stacked in a cascade formation, and a second upper connector on the redistribution substrate, the second upper connector electrically connecting the redistribution substrate to the second upper stack. The redistribution connector may be on one side edge at a top surface of the redistribution substrate. The first upper connector may be on one side edge at a top surface of the first upper stack. The second upper connector may be on one side edge at a top surface of the second upper stack.

According to some example embodiments of the present inventive concepts, a semiconductor package may include a substrate including a substrate pad, a first lower stack on the substrate, the first lower stack including a plurality of first lower semiconductor chips stacked on each other, a redistribution substrate on the first lower stack, the redistribution substrate including at least one redistribution pad, a first upper stack on the redistribution substrate, the first upper stack including a plurality of first upper semiconductor chips stacked in a cascade formation, each of the first upper semiconductor chips including a first upper pad that is exposed on one side edge at a top surface thereof, a second upper stack on the redistribution substrate and horizontally spaced apart from the first upper stack, the second upper stack including a plurality of second upper semiconductor chips stacked in a cascade formation, each of the second upper semiconductor chips including a second upper pad that is exposed on one side edge at a top surface thereof, a first upper connector electrically connecting the first upper pad to the redistribution substrate, and a second upper connector electrically connecting the second upper pad to the redistribution substrate.

According to some example embodiments of the present inventive concepts, a semiconductor package may include a substrate, a first lower stack on the substrate, the first lower stack including a plurality of first lower semiconductor chips stacked on each other, a controller on the substrate and horizontally spaced apart from the first lower stack, a second lower stack on the substrate and horizontally spaced apart from the first lower stack across the controller, a redistribution substrate on the first lower stack, the controller, and the second lower stack, the redistribution substrate including a redistribution pattern, a redistribution adhesive layer between a bottom surface of the redistribution substrate and the first and second lower stacks, a redistribution connector on the substrate, the redistribution connector electrically connecting the substrate to the redistribution substrate, a first upper stack on the redistribution substrate, the first upper stack including a plurality of first upper semiconductor chips stacked in a cascade formation, a first upper connector on the redistribution substrate, the first upper connector electrically connecting the redistribution substrate to the first upper semiconductor chips, a second upper stack on the redistribution substrate and horizontally spaced apart from the first upper stack, the second upper stack including a plurality of second upper semiconductor chips stacked in a cascade formation, a second upper connector on the redistribution substrate, the second upper connector electrically connecting the redistribution substrate to the second upper semiconductor chips, and a molding layer on the substrate, the molding layer covering the redistribution substrate, the first upper stack, and the second upper stack.

DETAILED DESCRIPTION

Some example embodiments of the present inventive concepts will now be described in detail with reference to the accompanying drawings to aid in clearly explaining the present inventive concepts.

Figure 1:
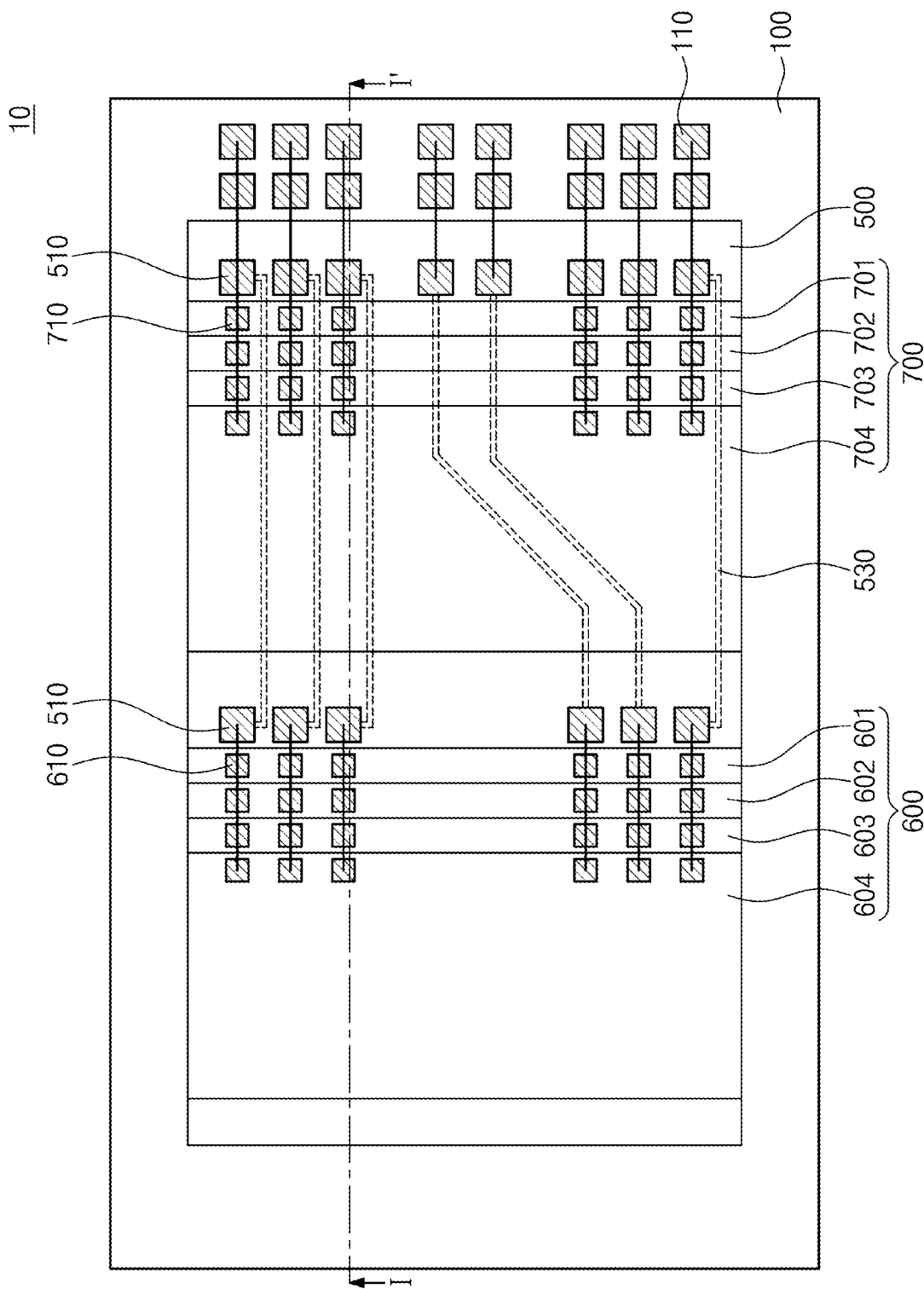
FIG. 1 illustrates a plan view showing a semiconductor package according to some example embodiments of the present inventive concepts.
Figure 2:
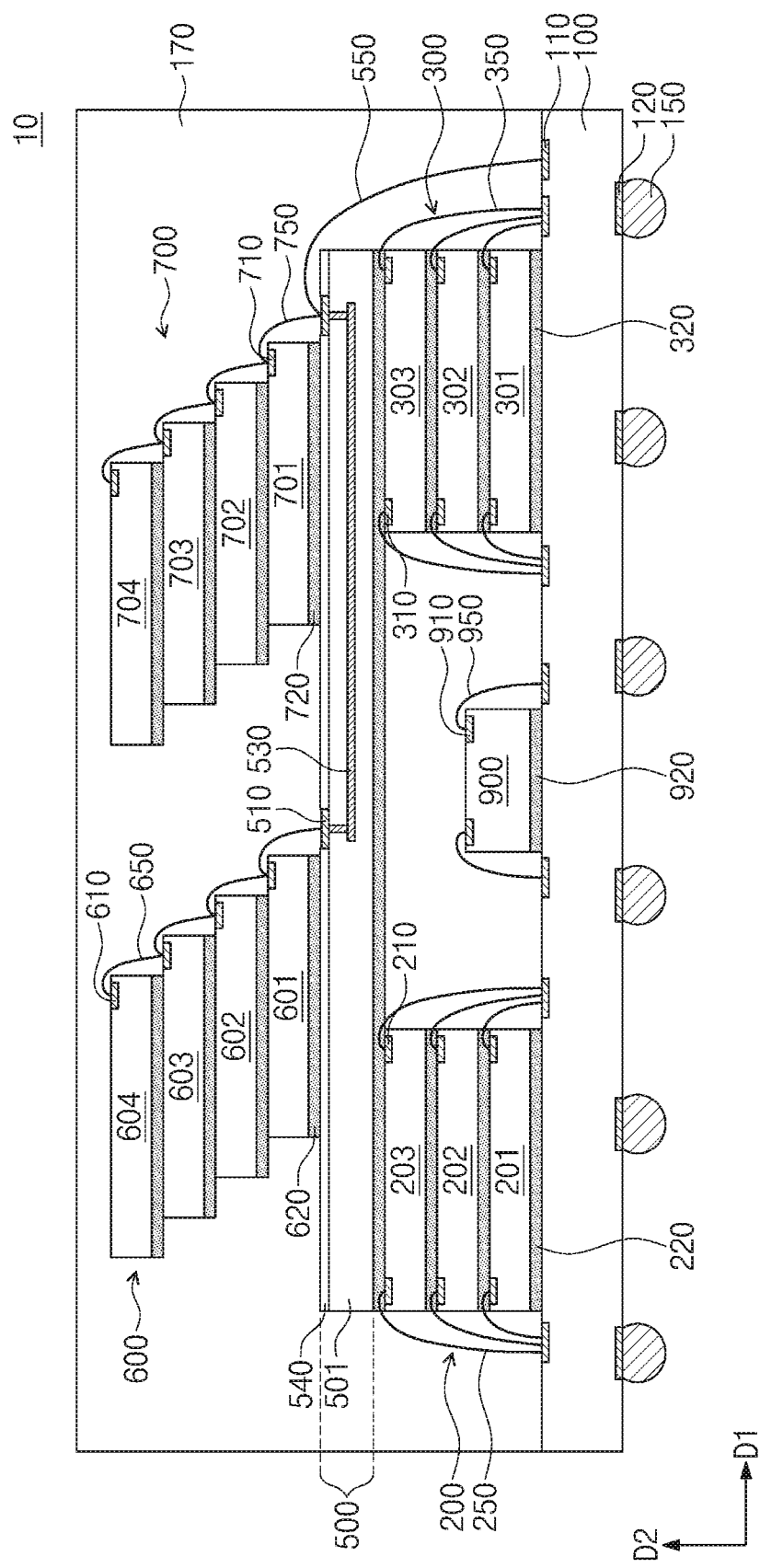
FIG. 2 illustrates a cross-sectional view taken along line I-I' of FIG. 1.

FIG. 1 illustrates a plan view showing a semiconductor package according to some example embodiments of the present inventive concepts. FIG. 2 illustrates a cross-sectional view taken along line I-I' of FIG. 1.

Referring to FIGS. 1 and 2, a semiconductor package 10 may include a substrate 100, a first lower stack 200, a second lower stack 300, a controller 900, a redistribution substrate 500, a first upper stack 600, a second upper stack 700, and a molding layer 170.

The substrate 100 may be, for example, a printed circuit board (PCB). The substrate 100 may include a substrate pad 110 and a terminal pad 120. The substrate pad 110 may be disposed and exposed on a top surface of the substrate 100. The terminal pad 120 may be disposed and exposed on a bottom surface of the substrate 100. The substrate pad 110 and the terminal pad 120 may include a conductive metallic material, for example, at least one metal selected from copper (Cu), aluminum (Al), tungsten (W), and titanium (Ti).

The substrate 100 may be provided on its bottom surface with an external terminal 150 disposed on a bottom surface of the terminal pad 120. The external terminal 150 may include a solder ball or a solder bump. The external terminal 150 may include a conductive metallic material, for example, one or more of tin (Sn), silver (Ag), zinc (Zn), and any alloy thereof. The external terminal 150 may be electrically connected to the substrate pad 110 through internal wiring lines (not shown) in the substrate 100. The external terminal 150 may be coupled to an external device. Therefore, external signals may be transmitted to and from the substrate pad 110 through the external terminal 150.

The first lower stack 200 may be disposed on the substrate 100. The first lower stack 200 may include a plurality of first lower semiconductor chips 201, 202, and 203. The first lower semiconductor chips 201, 202, and 203 may be stacked vertically (e.g., in a second direction D2 perpendicular to the top surface of the substrate 100). The first lower semiconductor chips 201, 202, and 203 may be memory chips or volatile memory chips, such as dynamic random access memory (DRAM). Each of the first lower semiconductor chips 201, 202, and 203 may include a first lower pad 210. The first lower pad 210 may be disposed on a top surface of each of the first lower semiconductor chips 201, 202, and 203. The first lower pad 210 may be provided in plural. The first lower pad 210 may include, for example, at least one metal selected from copper (Cu), aluminum (Al), tungsten (W), and titanium (Ti).

The first lower stack 200 and the substrate 100 may be electrically connected to each other through a first lower connector 250. The first lower connector 250 may be coupled to the first lower pad 210 and the substrate pad 110. In this description, the phrase "two components are electrically connected/coupled to each other" may include "two components are directly connected/coupled to each other" or "two component are indirectly connected/coupled to each other through other conductive component(s)." Therefore, the first lower semiconductor chips 201, 202, and 203 may be electrically connected to the substrate 100. The first lower connector 250 may be, for example, a bonding wire.

A first lower adhesive layer 220 may be interposed between the first lower semiconductor chips 201, 202, and 203 and between the substrate 100 and a lowermost one 201 of the first lower semiconductor chips 201, 202, and 203. The first lower adhesive layer 220 may include a dielectric polymer.

The controller 900 may be provided on the substrate 100. The controller 900 and the first lower stack 200 may be spaced apart from each other horizontally (e.g., in a first direction D1 parallel to the top surface of the substrate 100). The controller 900 may be, for example, a logic chip that controls a memory chip. The controller 900 may include a chip pad 910. The chip pad 910 may be disposed and exposed on a top surface of the controller 900. The chip pad 910 may include, for example, at least one metal selected from copper (Cu), aluminum (Al), tungsten (W), and titanium (Ti).

A chip adhesive layer 920 may be interposed between the controller 900 and the substrate 100. The chip adhesive layer 920 may include a dielectric polymer. The controller 900 and the substrate 100 may be electrically connected to each other through a chip connector 950. The chip connector 950 may be coupled to the chip pad 910 and the substrate pad 110. The chip connector 950 may be, for example, a bonding wire.

The second lower stack 300 may be provided on the substrate 100. The second lower stack 300 may be spaced apart horizontally (e.g., in the first direction D1) from the first lower stack 200 across the controller 900. The second lower stack 300 may include a plurality of second lower semiconductor chips 301, 302, and 303. The second lower semiconductor chips 301, 302, and 303 may be stacked vertically (e.g., in the second direction D2). The second lower semiconductor chips 301, 302, and 303 may be memory chips or volatile memory chips, such as dynamic random access memory (DRAM). Each of the second lower semiconductor chips 301, 302, and 303 may include a second lower pad 310. The second lower pad 310 may be disposed on a top surface of each of the second lower semiconductor chips 301, 302, and 303. The second lower pad 310 may be provided in plural. The second lower pad 310 may include, for example, at least one metal selected from copper (Cu), aluminum (Al), tungsten (W), and titanium (Ti).

The second lower stack 300 and the substrate 100 may be electrically connected to each other through a second lower connector 350. The second lower connector 350 may be coupled to the second lower pad 310 and the substrate pad 110. Therefore, the second lower semiconductor chips 301, 302, and 303 may be electrically connected to the substrate 100. The second lower connector 350 may be, for example, a bonding wire.

A second lower adhesive layer 320 may be interposed between the second lower semiconductor chips 301, 302, and 303 and between the substrate 100 and a lowermost one 301 of the second lower semiconductor chips 301, 302, and 303. The second lower adhesive layer 320 may include a dielectric polymer.

The redistribution substrate 500 may be provided on the first lower stack 200, the controller 900, and the second lower stack 300. The redistribution substrate 500 may be supported by the first lower stack 200 and the second lower stack 300. The redistribution substrate 500 may include a dielectric layer 501, a redistribution pad 510, a redistribution pattern 530, and a passivation layer 540. The dielectric layer 501 may include an organic material, such as a photosensitive polymer. The photosensitive polymer may include, for example, one or more of photosensitive polyimide, polybenzoxazole, phenolic polymers, and benzocyclobutene polymers. The dielectric layer 501 may include, for example, a photo-imageable dielectric (PID), but the present inventive concepts are not limited thereto. The dielectric layer 501 may cover the redistribution pattern 530.

The redistribution pad 510 may be disposed on a top surface of the redistribution substrate 500. The redistribution pad 510 may be provided in plural. One or more of the plurality of redistribution pads 510 may be disposed on one side of the first upper stack 600. For example, one or more of the redistribution pads 510 may be placed between the first upper stack 600 and the second upper stack 700. Other one or more of the redistribution pads 510 may be disposed on one side of the second upper stack 700. The redistribution pad 510 may include, for example, at least one metal selected from copper (Cu), aluminum (Al), tungsten (W), and titanium (Ti). The redistribution pattern 530 may be provided in the redistribution substrate 500. The redistribution pattern 530 may include, for example, at least one metal selected from copper (Cu), aluminum (Al), tungsten (W), and titanium (Ti). The redistribution pattern 530 may be coupled to the redistribution pads 510.

The passivation layer 540 may be provided on the dielectric layer 501, thereby covering a top surface of the dielectric layer 501. The passivation layer 540 may expose top surfaces of the redistribution pads 510. Differently from that shown, the passivation layer 540 may not be included in some example embodiments of the present inventive concepts.

A redistribution connector 550 may be disposed on the substrate 100 and may extend toward one lateral surface or along one side of the redistribution substrate 500. For example, the redistribution connector may be on one side edge at a top surface of the redistribution substrate. The redistribution substrate 500 and the substrate 100 may be electrically connected to each other through the redistribution connector 550. The redistribution connector 550 may be coupled to the substrate pad 110 and the redistribution pad 510. Therefore, the redistribution pattern 530 may be electrically connected to the substrate 100. The redistribution connector 550 may be, for example, a bonding wire.

The first upper stack 600 may be disposed on the redistribution substrate 500. The first upper stack 600 may include a plurality of first upper semiconductor chips 601, 602, 603, and 604. The first upper semiconductor chips 601, 602, 603, and 604 may be memory chips, for example, nonvolatile memory chips such as NAND Flash memory. Each of the first upper semiconductor chips 601, 602, 603, and 604 may include a first upper pad 610. The first upper pad 610 may be disposed on a top surface of each of the first upper semiconductor chips 601, 602, 603, and 604. The first upper pad 610 may be exposed on one side edge (e.g., a right side edge) at the top surface of each of the first upper semiconductor chips 601, 602, 603, and 604. The first upper pad 610 may be provided in plural. The first upper pad 610 may include, for example, at least one metal selected from copper (Cu), aluminum (Al), tungsten (W), and titanium (Ti). The first upper semiconductor chips 601, 602, 603, and 604 may be stacked in a cascade formation to expose the first upper pads 610. For example, the first upper stack 600 may have a cascade structure that descends in the first direction D1.

A first upper connector 650 may be disposed on the redistribution substrate 500 and may extend toward or along one lateral surface of the first upper stack 600. For example, the first upper connector may be on one side edge at a top surface of the first upper stack. The redistribution substrate 500 and the first upper stack 600 may be electrically connected to each other through the first upper connector 650. The first upper connector 650 may be coupled to the redistribution pad 510 and the first upper pad 610. For example, the first upper connector 650 may be coupled to one of redistribution pads 510 disposed between the first upper stack 600 and the second upper stack 700. Therefore, the first upper semiconductor chips 601, 602, 603, and 604 may be electrically connected to the redistribution substrate 500. The first upper connector 650 may be, for example, a bonding wire.

A first upper adhesive layer 620 may be interposed between the first upper semiconductor chips 601, 602, 603, and 604 and between the redistribution substrate 500 and a lowermost one 601 of the first upper semiconductor chips 601, 602, 603, and 604. The first upper adhesive layer 620 may include a dielectric polymer.

The second upper stack 700 may be disposed on the redistribution substrate 500. The second upper stack 700 may be spaced apart horizontally (e.g., in the first direction D1) from the first upper stack 600. The second upper stack 700 may include a plurality of second upper semiconductor chips 701, 702, 703, and 704. The second upper semiconductor chips 701, 702, 703, and 704 may be memory chips, for example, nonvolatile memory chips such as NAND Flash memory. Each of the second upper semiconductor chips 701, 702, 703, and 704 may include a second upper pad 710. The second upper pad 710 may be disposed on a top surface of each of the second upper semiconductor chips 701, 702, 703, and 704. The second upper pad 710 may be exposed on one side edge (e.g., a right side edge) at the top surface of each of the second upper semiconductor chips 701, 702, 703, and 704. The second upper pad 710 may be provided in plural. The second upper pad 710 may include, for example, at least one metal selected from copper (Cu), aluminum (Al), tungsten (W), and titanium (Ti). The second upper semiconductor chips 701, 702, 703, and 704 may be stacked in a cascade formation to expose the second upper pads 710. For example, the second upper stack 700 may have a cascade structure that descends in the first direction D1.

A second upper connector 750 may be disposed on the redistribution substrate 500 and may extend toward or along one lateral surface of the second upper stack 700. For example, the second upper connector may be on one side edge at a top surface of the second upper stack. The redistribution substrate 500 and the second upper stack 700 may be electrically connected to each other through the second upper connector 750. The second upper connector 750 may be coupled to the redistribution pad 510 and the second upper pad 710. For example, the second upper connector 750 may be coupled to another of the redistribution pads 510 disposed on one side of the second upper stack 700. Therefore, the second upper semiconductor chips 701, 702, 703, and 704 may be electrically connected to the redistribution substrate 500. The second upper connector 750 may be, for example, a bonding wire.

A second upper adhesive layer 720 may be interposed between the second upper semiconductor chips 701, 702, 703, and 704 and between the redistribution substrate 500 and a lowermost one 701 of the second upper semiconductor chips 701, 702, 703, and 704. The second upper adhesive layer 720 may include a dielectric polymer.

The molding layer 170 may be disposed on the substrate 100. The molding layer 170 may cover the first lower stack 200, the second lower stack 300, the redistribution substrate 500, the first upper stack 600, the second upper stack 700, and the controller 900. The molding layer 170 may include a dielectric polymer (e.g., an epoxy-based molding compound).

Depending on functions, a portion of the redistribution pattern 530 may be electrically connected to the first upper connector 650 and the second upper connector 750. Another portion of the redistribution pattern 530 may be electrically connected only one of the first and second upper connectors 650 and 750. For example, signals and/or data of each of the first and second upper stacks 600 and 700 may be distributed or integrated to the redistribution pad 510, and then may be transferred to or from the controller 900.

According to the present inventive concepts, because the first upper connector 650 is disposed on one side edge at a top surface of the first upper stack 600, and because the second upper connector 750 is disposed on one side edge of a top surface of the second upper stack 700, a length of the redistribution pattern 530 may be reduced or minimized to increase speed and stability of signal transmission. Accordingly, the semiconductor package 10 may improve in electrical characteristics.

According to the present inventive concepts, because the redistribution substrate 500 is disposed on the first lower stack 200, it may be possible to reduce complexity of bonding wires connected the substrate 100 and of wiring lines in the substrate 100. Thus, the substrate 100 may decrease in thickness. Further, because the first and second upper stacks 600 and 700 are disposed on the redistribution substrate 500, the semiconductor package 10 may have high integration and a compact size.

Moreover, compared to a structure of single upper chip stack, because the first and second upper stacks 600 and 700 are disposed on the redistribution substrate 500, the molding layer 170 may have a decreased height on the first and second upper stacks 600 and 700. Therefore, a stress may be reduced at an interface between the molding layer 170 and each of the first and second upper stacks 600 and 700, and accordingly, delamination of an uppermost semiconductor chip may be mitigated or prevented in a reflow procedure after moisture absorption.

Figure 3:
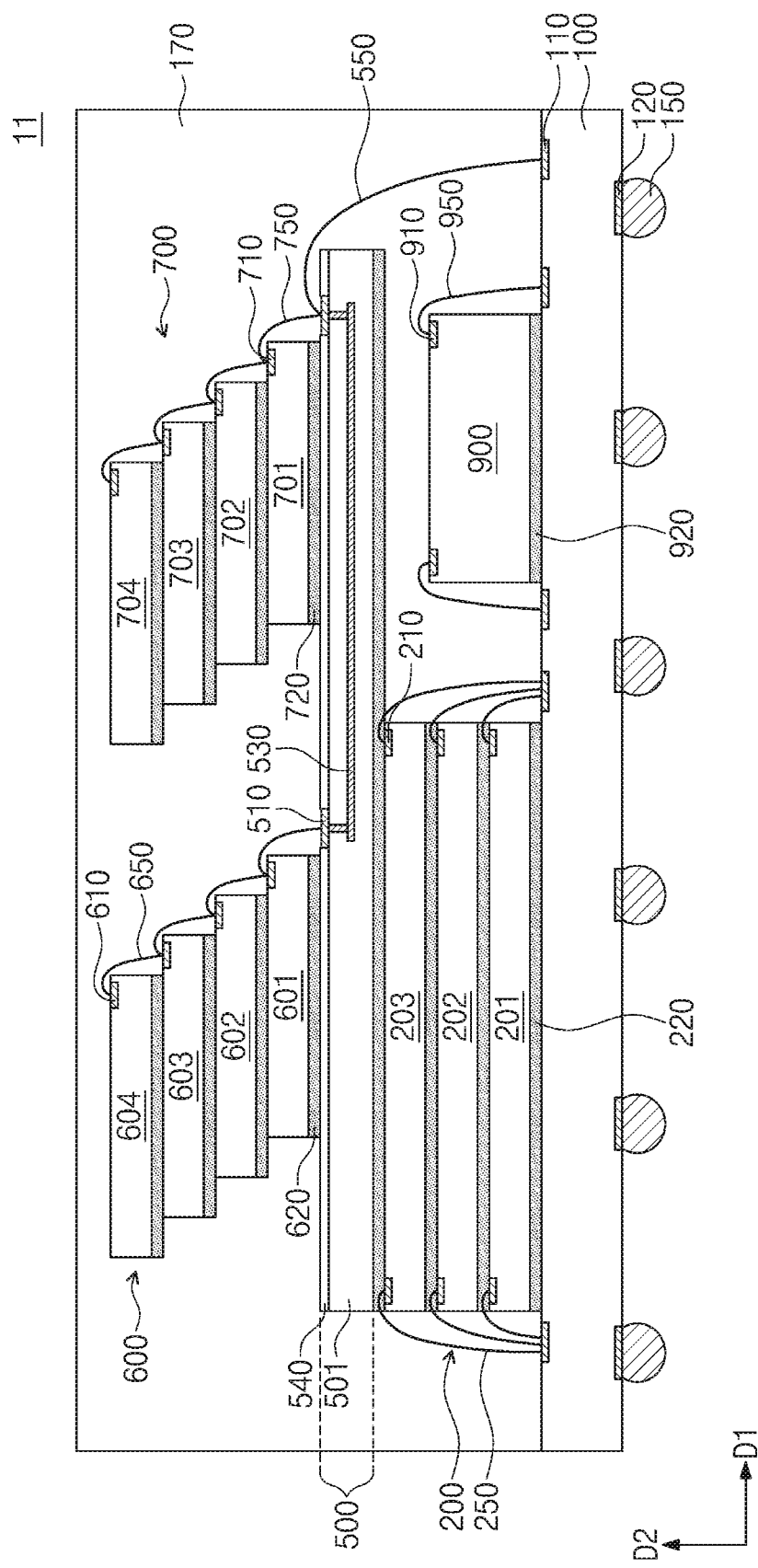
FIG. 3 illustrates a cross-sectional view showing a semiconductor package according to some example embodiments of the present inventive concepts.

FIG. 3 illustrates a cross-sectional view showing a semiconductor package according to some example embodiments of the present inventive concepts. FIG. 3 corresponds to a cross-section taken along line I-I' of FIG. 1. A duplicate description will be omitted below.

Referring to FIGS. 1 and 3, a semiconductor package 11 may include the substrate 100, the first lower stack 200, the controller 900, the redistribution substrate 500, the first upper stack 600, the second upper stack 700, and the molding layer 170.

The first lower stack 200 and the controller 900 may be disposed on the substrate 100. The controller 900 may be spaced apart horizontally (e.g., in the first direction D1) from the first lower stack 200. The first lower stack 200 may have a size enough to support the redistribution substrate 500 on the first lower stack 200. The first lower semiconductor chips 201, 202, and 203 may be stacked vertically (e.g., in the second direction D2). Differently from that shown, in some example embodiments of the present inventive concepts, the first lower semiconductor chips 201, 202, and 203 may be stacked in a cascade formation.

The redistribution substrate 500 may be disposed on the first lower stack 200 and the controller 900. The redistribution substrate 500 may be supported by the first lower stack 200. The first upper stack 600 and the second upper stack 700 may be disposed on the redistribution substrate 500. A description of the substrate 100, the first upper stack 600, and the second upper stack 700 may be the same as or substantially similar to that discussed above with reference to FIGS. 1 and 2.

The molding layer 170 may be provided on the substrate 100. The molding layer 170 may cover the first lower stack 200, the redistribution substrate 500, the first upper stack 600, the second upper stack 700, and the controller 900.

Figure 4:
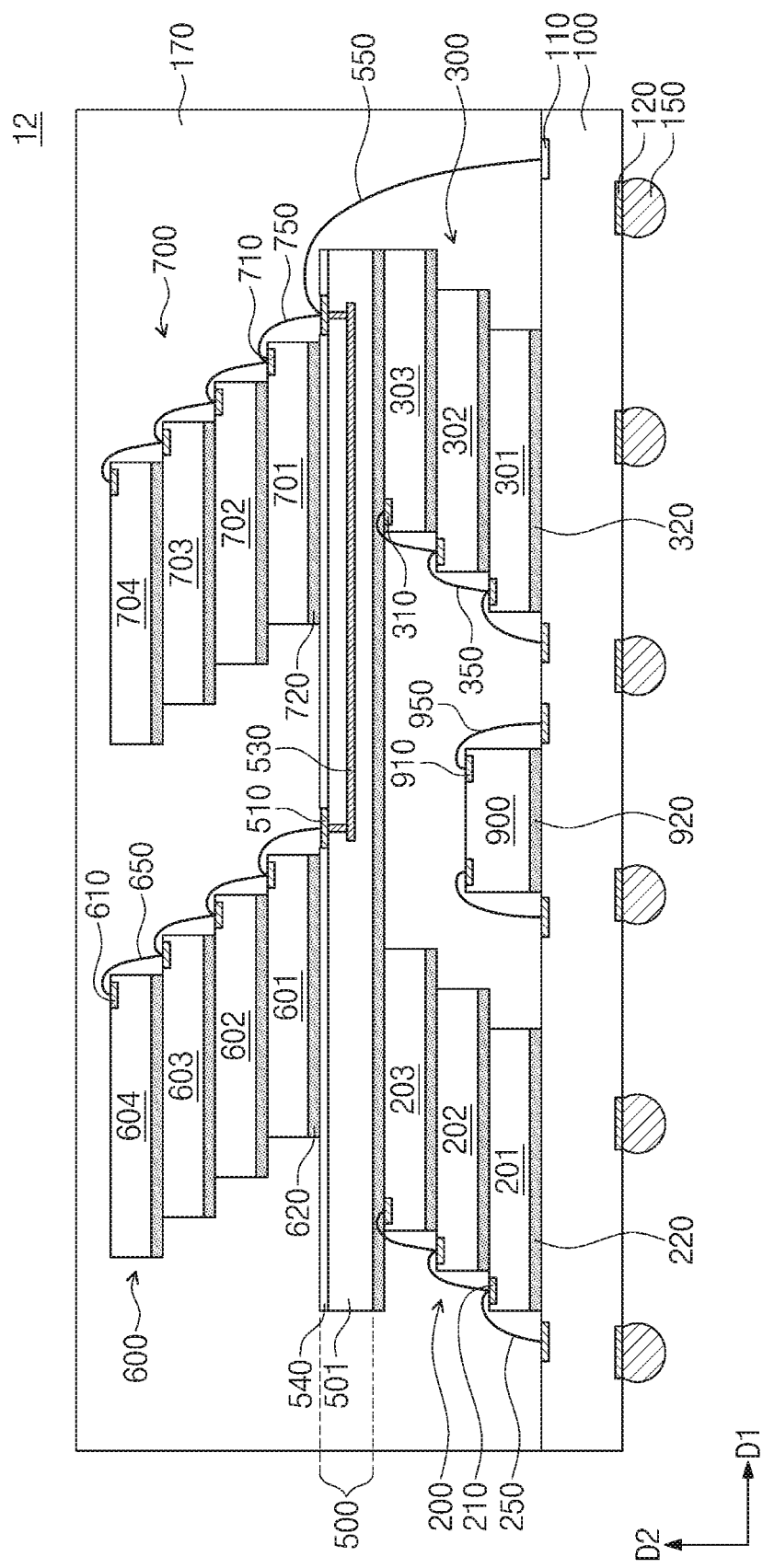
FIG. 4 illustrates a cross-sectional view showing a semiconductor package according to some example embodiments of the present inventive concepts.

FIG. 4 illustrates a cross-sectional view showing a semiconductor package according to some example embodiments of the present inventive concepts. FIG. 4 corresponds to a cross-section taken along line I-I' of FIG. 1. A duplicate description will be omitted below.

Referring to FIGS. 1 and 4, a semiconductor package 12 may include the substrate 100, the first lower stack 200, the second lower stack 300, the controller 900, the redistribution substrate 500, the first upper stack 600, the second upper stack 700, and the molding layer 170.

The first lower stack 200, the controller 900, and the second lower stack 300 may be disposed on the substrate 100. The first lower pad 210 may be disposed on a top surface of each of the first lower semiconductor chips 201, 202, and 203. The first lower pad 210 may be exposed on one side edge (e.g., a left side edge) at the top surface of each of the first lower semiconductor chips 201, 202, and 203. The first lower semiconductor chips 201, 202, and 203 may be stacked in a cascade formation to expose the first lower pads 210. For example, the first lower stack 200 may have a cascade structure that ascends in the first direction D1.

The second lower pad 310 may be disposed on a top surface of each of the second lower semiconductor chips 301, 302, and 303. The second lower pad 310 may be exposed on one side edge (e.g., a left side edge) at the top surface of each of the second lower semiconductor chips 301, 302, and 303. The second lower semiconductor chips 301, 302, and 303 may be stacked in a cascade formation to expose the second lower pads 310. For example, the second lower stack 300 may have a cascade structure that ascends in the first direction D1.

The redistribution substrate 500 may be provided on the first lower stack 200, the second lower stack 300, and the controller 900. The redistribution substrate 500 may be supported by the first lower stack 200 and the second lower stack 300. The first upper stack 600 and the second upper stack 700 may be disposed on the redistribution substrate 500. The molding layer 170 may be disposed on the substrate 100. A description of the substrate 100, the redistribution substrate 500, the first upper stack 600, the second upper stack 700, the controller 900, and the molding layer 170 may be the same as or substantially similar to that discussed above with reference to FIGS. 1 and 2.

Figure 5:
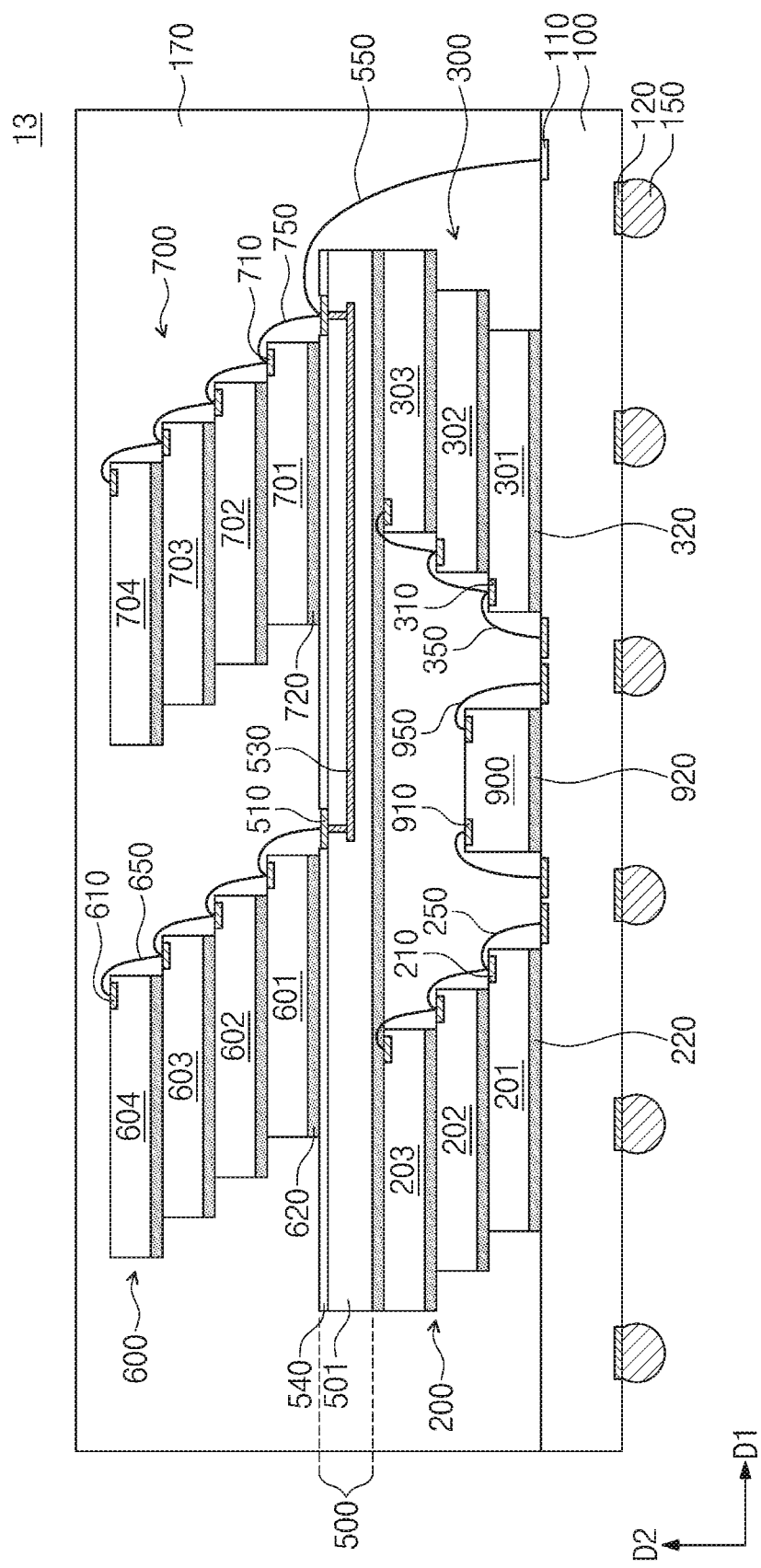
FIG. 5 illustrates a cross-sectional view showing a semiconductor package according to some example embodiments of the present inventive concepts.

FIG. 5 illustrates a cross-sectional view showing a semiconductor package according to some example embodiments of the present inventive concepts. FIG. 5 corresponds to a cross-section taken along line I-I' of FIG. 1. A duplicate description will be omitted below.

Referring to FIGS. 1 and 5, a semiconductor package 13 may include the substrate 100, the first lower stack 200, the second lower stack 300, the controller 900, the redistribution substrate 500, the first upper stack 600, the second upper stack 700, and the molding layer 170.

The first lower stack 200, the controller 900, and the second lower stack 300 may be disposed on the substrate 100. The first lower pad 210 may be disposed on a top surface of each of the first lower semiconductor chips 201, 202, and 203. The first lower pad 210 may be exposed on one side edge (e.g., a right side edge) at the top surface of each of the first lower semiconductor chips 201, 202, and 203. The first lower semiconductor chips 201, 202, and 203 may be stacked in a cascade formation to expose the first lower pads 210. For example, the first lower stack 200 may have a cascade structure that descends in the first direction D1.

The second lower pad 310 may be disposed on a top surface of each of the second lower semiconductor chips 301, 302, and 303. The second lower pad 310 may be exposed on one side edge (e.g., a left side edge) at the top surface of each of the second lower semiconductor chips 301, 302, and 303. The second lower semiconductor chips 301, 302, and 303 may be stacked in a cascade formation to expose the second lower pads 310. For example, the second lower stack 300 may have a cascade structure that ascends in the first direction D1.

The redistribution substrate 500 may be disposed on the first lower stack 200, the second lower stack 300, and the controller 900. The redistribution substrate 500 may be supported by the first lower stack 200 and the second lower stack 300. The first upper stack 600 and the second upper stack 700 may be disposed on the redistribution substrate 500. The molding layer 170 may be disposed on the substrate 100. A description of the substrate 100, the redistribution substrate 500, the first upper stack 600, the second upper stack 700, the controller 900, and the molding layer 170 may be the same as or substantially similar to that discussed above with reference to FIGS. 1 and 2.

Figure 6:
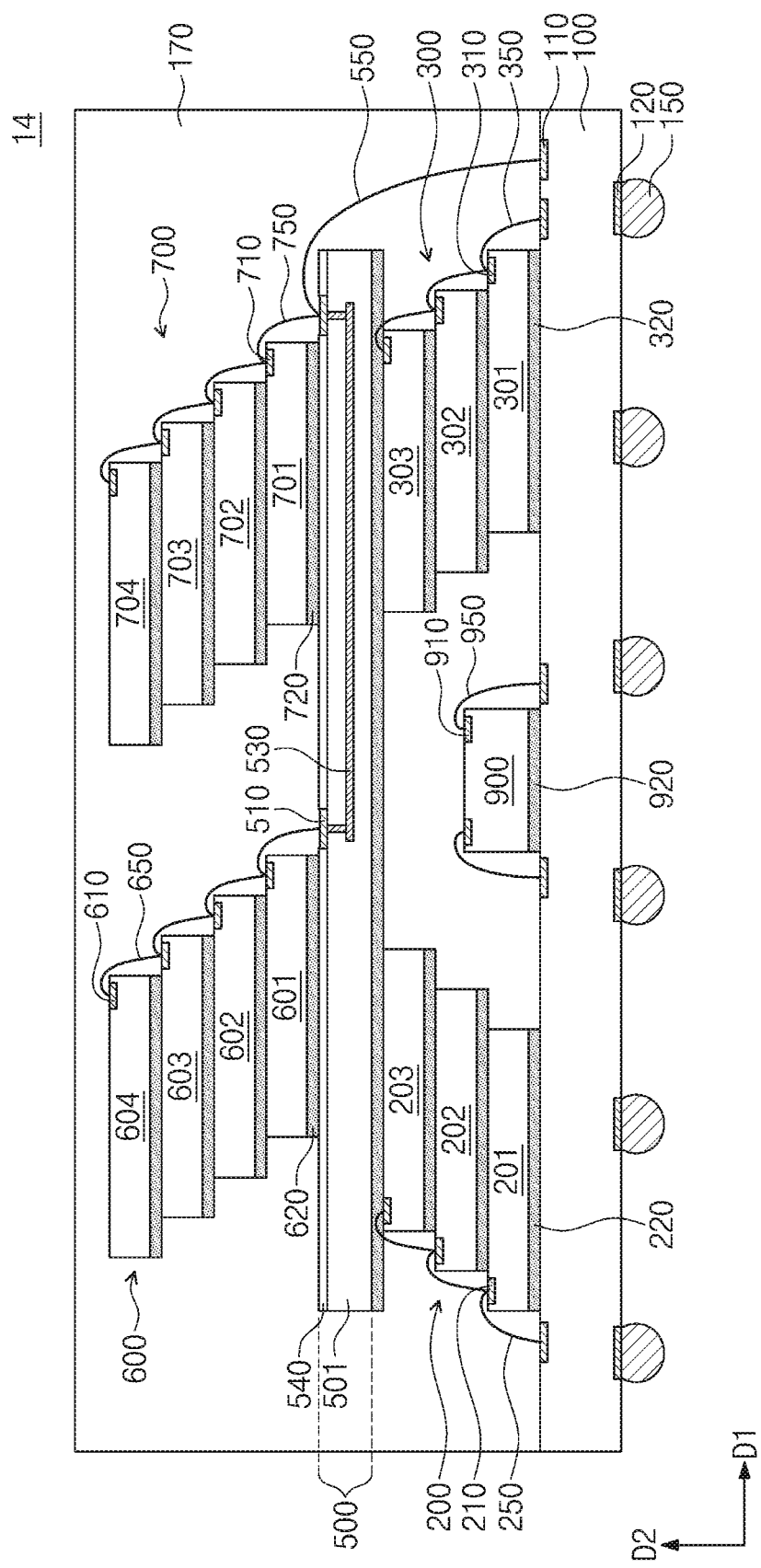
FIG. 6 illustrates a cross-sectional view showing a semiconductor package according to some example embodiments of the present inventive concepts.

FIG. 6 illustrates a cross-sectional view showing a semiconductor package according to some example embodiments of the present inventive concepts. FIG. 6 corresponds to a cross-section taken along line I-I' of FIG. 1. A duplicate description will be omitted below.

Referring to FIGS. 1 and 6, a semiconductor package 14 may include the substrate 100, the first lower stack 200, the second lower stack 300, the controller 900, the redistribution substrate 500, the first upper stack 600, the second upper stack 700, and the molding layer 170.

The first lower stack 200, the controller 900, and the second lower stack 300 may be disposed on the substrate 100. The first lower pad 210 may be disposed on a top surface of each of the first lower semiconductor chips 201, 202, and 203. The first lower pad 210 may be exposed on one side edge (e.g., a left side edge) at the top surface of each of the first lower semiconductor chips 201, 202, and 203. The first lower semiconductor chips 201, 202, and 203 may be stacked in a cascade formation to expose the first lower pads 210. For example, the first lower stack 200 may have a cascade structure that ascends in the first direction D1.

The second lower pad 310 may be disposed on a top surface of each of the second lower semiconductor chips 301, 302, and 303. The second lower pad 310 may be exposed on one side edge (e.g., a right side edge) at the top surface of each of the second lower semiconductor chips 301, 302, and 303. The second lower semiconductor chips 301, 302, and 303 may be stacked in a cascade formation to expose the second lower pads 310. For example, the second lower stack 300 may have a cascade structure that descends in the first direction D1.

The redistribution substrate 500 may be disposed on the first lower stack 200, the second lower stack 300, and the controller 900. The redistribution substrate 500 may be supported by the first lower stack 200 and the second lower stack 300. The first upper stack 600 and the second upper stack 700 may be disposed on the redistribution substrate 500. The molding layer 170 may be disposed on the substrate 100. A description of the substrate 100, the redistribution substrate 500, the first upper stack 600, the second upper stack 700, the controller 900, and the molding layer 170 may be the same as or substantially similar to that discussed above with reference to FIGS. 1 and 2.

Figure 7:
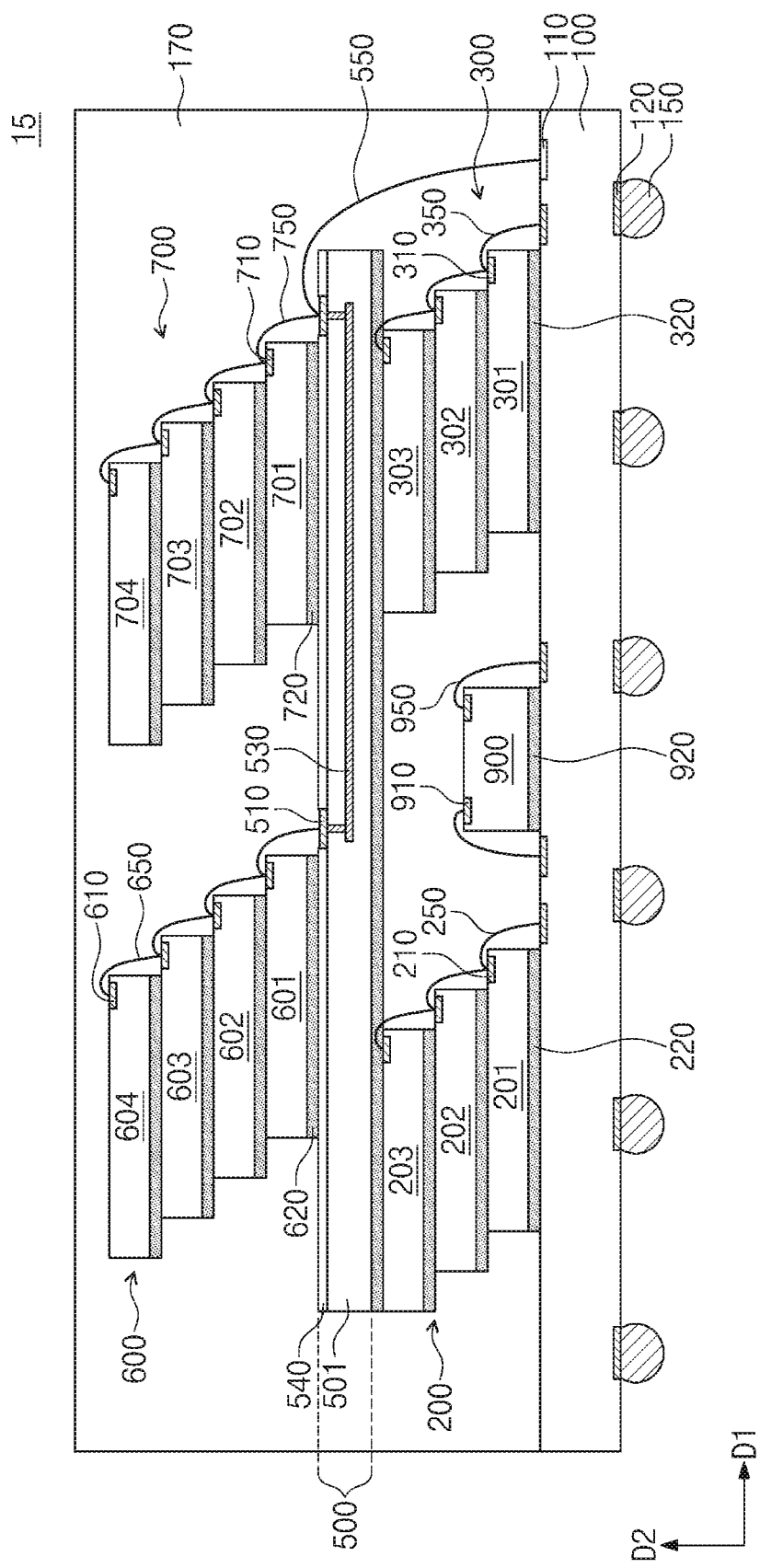
FIG. 7 illustrates a cross-sectional view showing a semiconductor package according to some example embodiments of the present inventive concepts.

FIG. 7 illustrates a cross-sectional view showing a semiconductor package according to some example embodiments of the present inventive concepts. FIG. 7 corresponds to a cross-section taken along line I-I' of FIG. 1. A duplicate description will be omitted below.

Referring to FIGS. 1 and 7, a semiconductor package 15 may include the substrate 100, the first lower stack 200, the second lower stack 300, the controller 900, the redistribution substrate 500, the first upper stack 600, the second upper stack 700, and the molding layer 170.

The first lower stack 200, the controller 900, and the second lower stack 300 may be disposed on the substrate 100. The first lower pad 210 may be disposed on a top surface of each of the first lower semiconductor chips 201, 202, and 203. The first lower pad 210 may be exposed on one side edge (e.g., a right side edge) at the top surface of each of the first lower semiconductor chips 201, 202, and 203. The first lower semiconductor chips 201, 202, and 203 may be stacked in a cascade formation to expose the first lower pads 210. For example, the first lower stack 200 may have a cascade structure that descends in the first direction D1.

The second lower pad 310 may be disposed on a top surface of each of the second lower semiconductor chips 301, 302, and 303. The second lower pad 310 may be exposed on one side edge (e.g., a right side edge) at the top surface of each of the second lower semiconductor chips 301, 302, and 303. The second lower semiconductor chips 301, 302, and 303 may be stacked in a cascade formation to expose the second lower pads 310. For example, the second lower stack 300 may have a cascade structure that descends in the first direction D1.

The redistribution substrate 500 may be disposed on the first lower stack 200, the second lower stack 300, and the controller 900. The redistribution substrate 500 may be supported by the first lower stack 200 and the second lower stack 300. The first upper stack 600 and the second upper stack 700 may be disposed on the redistribution substrate 500. The molding layer 170 may be provided on the substrate 100. A description of the substrate 100, the redistribution substrate 500, the first upper stack 600, the second upper stack 700, the controller 900, and the molding layer 170 may be the same as or substantially similar to that discussed above with reference to FIGS. 1 and 2.

Figure 8:
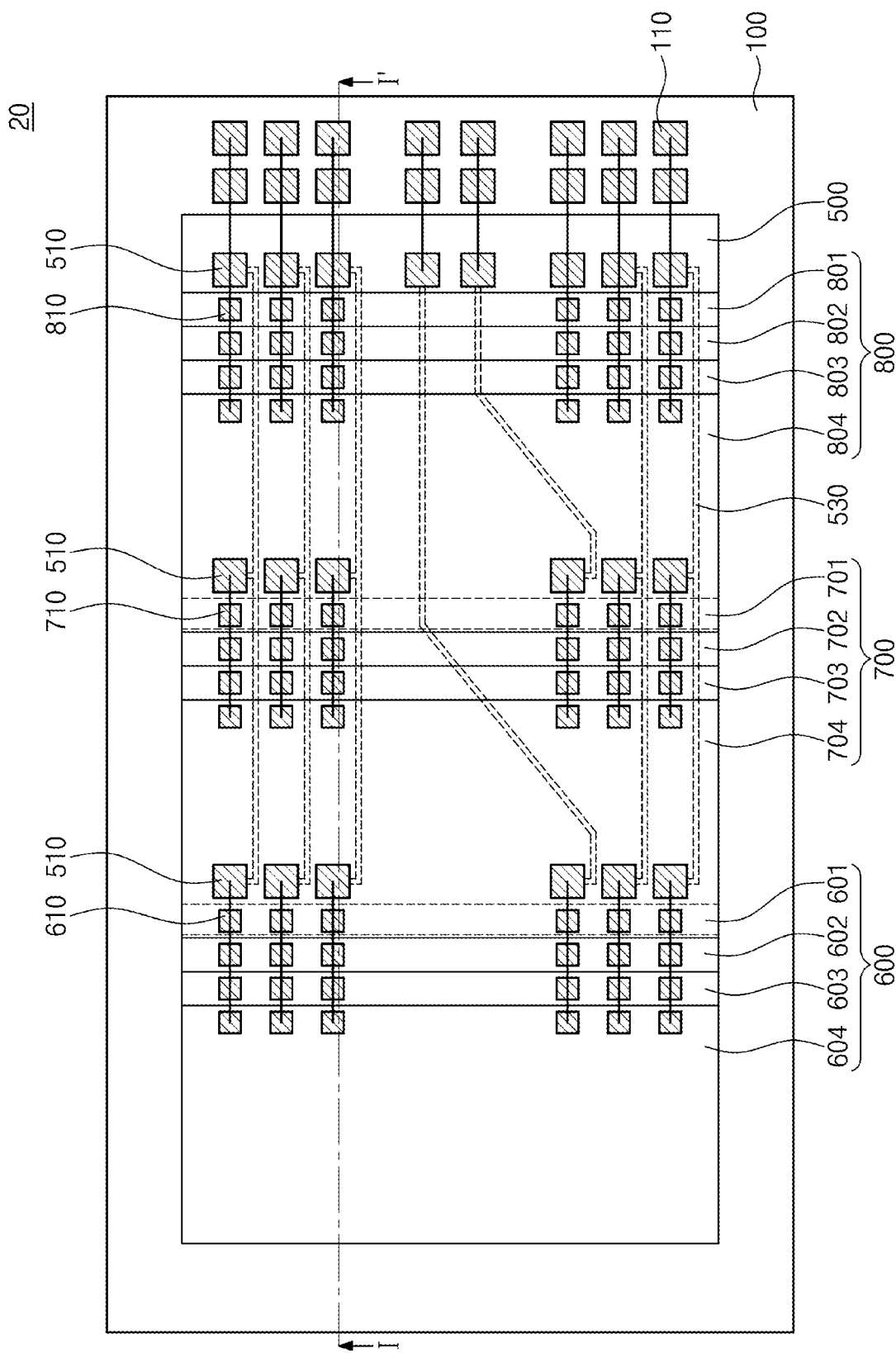
FIG. 8 illustrates a plan view showing a semiconductor package according to some example embodiments of the present inventive concepts.
Figure 9:
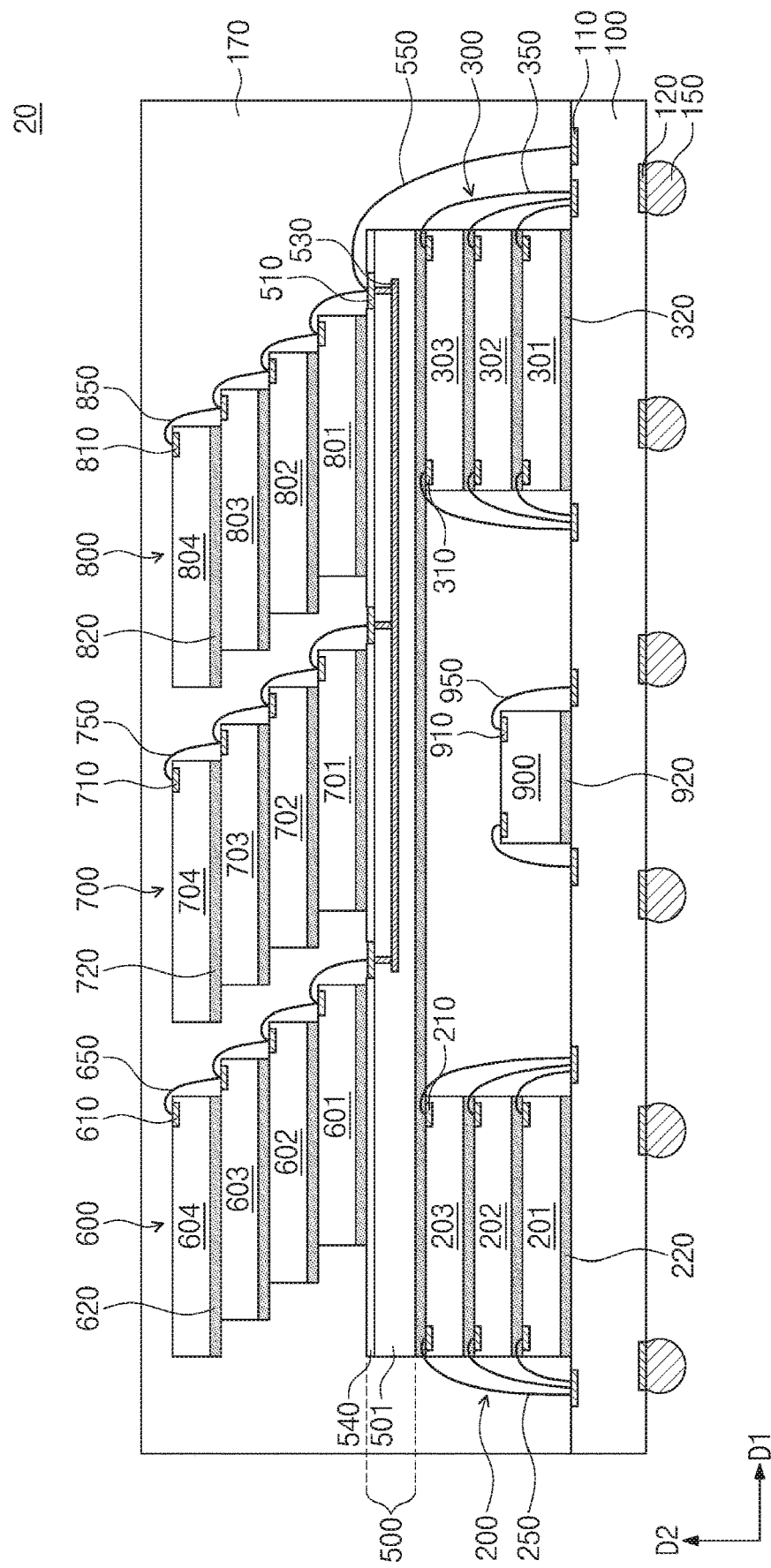
FIG. 9 illustrates a cross-sectional view taken along line I-I' of FIG. 8.

FIG. 8 illustrates a plan view showing a semiconductor package according to some example embodiments of the present inventive concepts. FIG. 9 illustrates a cross-sectional view taken along line I-I' of FIG. 8. A duplicate description will be omitted below.

Referring to FIGS. 8 and 9, a semiconductor package 20 may include the substrate 100, the first lower stack 200, the second lower stack 300, the controller 900, the redistribution substrate 500, the first upper stack 600, the second upper stack 700, and the molding layer 170, and may further include a third upper stack 800.

The first lower stack 200, the controller 900, and the second lower stack 300 may be disposed on the substrate 100. The redistribution substrate 500 may be disposed on the first lower stack 200, the second lower stack 300, and the controller 900. The first upper stack 600 and the second upper stack 700 may be provided on the redistribution substrate 500. The redistribution substrate 500 may include the redistribution pads 510. One or more of the redistribution pads 510 may be disposed on one side of the third upper stack 800. A description of the substrate 100, the first lower stack 200, the second lower stack 300, the redistribution substrate 500, the first upper stack 600, the second upper stack 700, and the controller 900 may be the same as or substantially similar to that discussed above with reference to FIGS. 1 and 2.

The third upper stack 800 may be provided on the redistribution substrate 500. The third upper stack 800 may be spaced apart horizontally (e.g., in the first direction D1) from the first upper stack 600 across the second upper stack 700. The third upper stack 800 may include a plurality of third upper semiconductor chips 801, 802, 803, and 804. The third upper semiconductor chips 801, 802, 803, and 804 may be memory chips, for example, nonvolatile memory chips such as NAND Flash memory. Each of the third upper semiconductor chips 801, 802, 803, and 804 may include a third upper pad 810. The third upper pad 810 may be disposed on a top surface of each of the third upper semiconductor chips 801, 802, 803, and 804. The third upper pad 810 may be exposed on one side edge (e.g., a right side edge) at the top surface of each of the third upper semiconductor chips 801, 802, 803, and 804. The third upper pad 810 may be provided in plural. The third upper pad 810 may include, for example, at least one metal selected from copper (Cu), aluminum (Al), tungsten (W), and titanium (Ti). The third upper semiconductor chips 801, 802, 803, and 804 may be stacked in a cascade formation to expose the third upper pads 810. For example, the third upper stack 800 may have a cascade structure that descends in the first direction D1.

A third upper connector 850 may be disposed on the redistribution substrate 500 and may extend toward one lateral surface or extend along one side of the third upper stack 800. The redistribution substrate 500 and the third upper stack 800 may be electrically connected to each other through the third upper connector 850. The third upper connector 850 may be coupled to the redistribution pad 510 and the third upper pad 810. For example, the third upper connector 850 may be coupled to one of the redistribution pads 510 disposed on one side of the third upper stack 800. Therefore, the third upper semiconductor chips 801, 802, and 803 may be electrically connected to the redistribution substrate 500. The third upper connector 850 may be, for example, a bonding wire.

A third upper adhesive layer 820 may be interposed between the third upper semiconductor chips 801, 802, 803, and 804 and between the redistribution substrate 500 and a lowermost one 801 of the third upper semiconductor chips 801, 802, 803, and 804. The third upper adhesive layer 820 may include a dielectric polymer.

The molding layer 170 may be provided on the substrate 100. The molding layer 170 may cover the first lower stack 200, the second lower stack 300, the redistribution substrate 500, the first upper stack 600, the second upper stack 700, the third upper stack 800, and the controller 900.

Depending on functions, a portion of the redistribution pattern 530 may be electrically connected to the first upper connector 650, the second upper connector 750, and the third upper connector 850. Another portion of the redistribution pattern 530 may be electrically connected to only one of the first, second, and third upper connectors 650, 750, and 850. For example, signals and/or data of each of the first, second, and third upper stacks 600, 700, and 800 may be distributed or integrated to the redistribution pad 510, and then may be transferred to or from the controller 900.

According to the present inventive concepts, because the first upper connector 650 is disposed on one side edge at a top surface of the first upper stack 600, because the second upper connector 750 is disposed on one side edge at a top surface of the second upper stack 700, and because the third upper connector 850 is disposed on one side edge at a top surface of the third upper stack 800, a length of the redistribution pattern 530 may be reduced or minimized to increase speed and stability of signal transmission. Accordingly, the semiconductor package 20 may improve in electrical characteristics.

According to the present inventive concepts, because the first, second, and third upper stacks 600, 700, and 800 are disposed on the redistribution substrate 500, the semiconductor package 20 may have high integration and a compact size.

Figure 10:
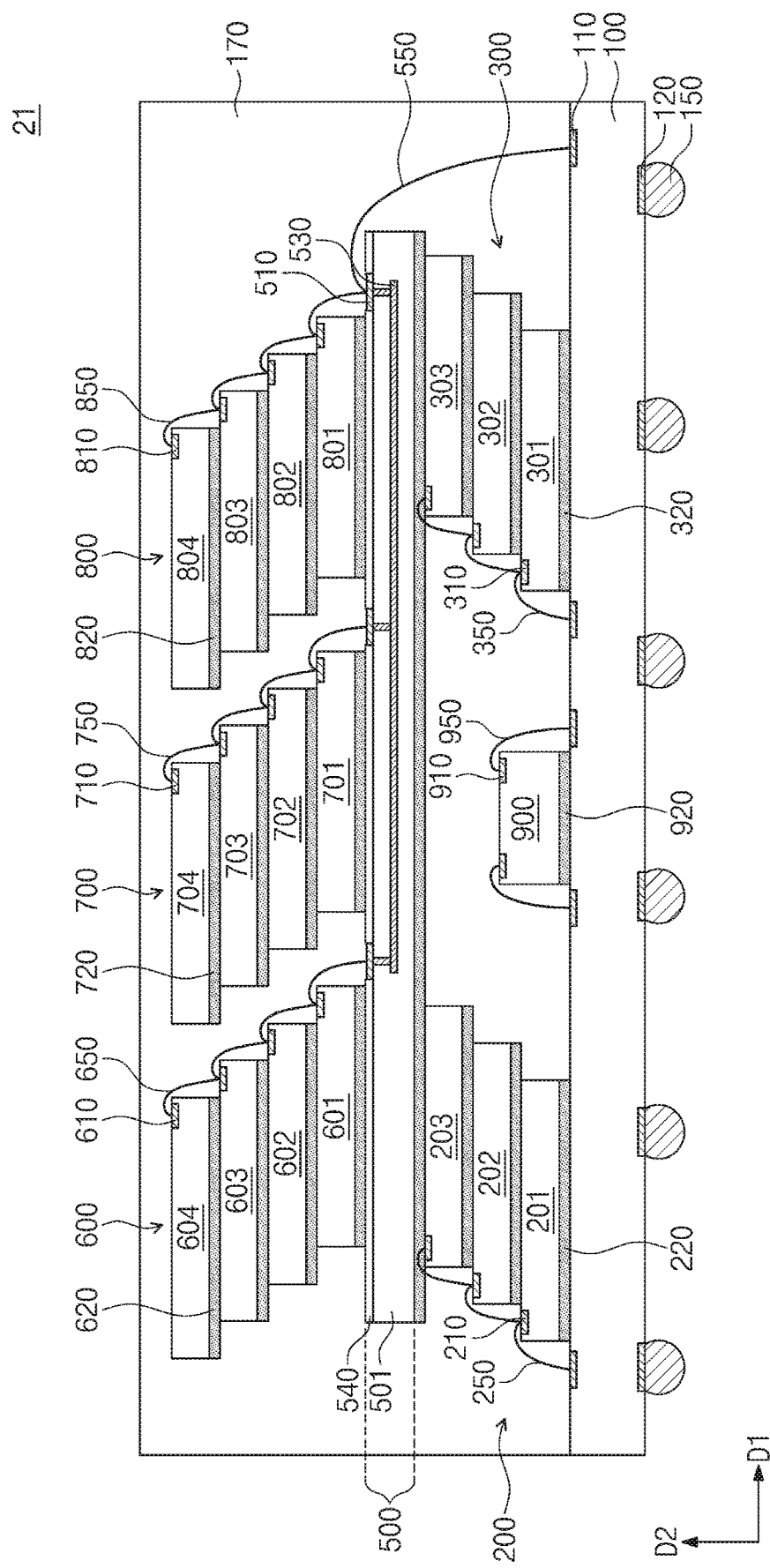
FIG. 10 illustrates a cross-sectional view showing a semiconductor package according to some example embodiments of the present inventive concepts.

FIG. 10 illustrates a cross-sectional view showing a semiconductor package according to some example embodiments of the present inventive concepts. FIG. 10 corresponds to a cross-section taken along line I-I' of FIG. 8. A duplicate description will be omitted below.

Referring to FIGS. 8 and 10, a semiconductor package 21 may include the substrate 100, the first lower stack 200, the second lower stack 300, the controller 900, the redistribution substrate 500, the first upper stack 600, the second upper stack 700, the third upper stack 800, and the molding layer 170.

The first lower stack 200, the controller 900, and the second lower stack 300 may be disposed on the substrate 100. The first lower pad 210 may be disposed on a top surface of each of the first lower semiconductor chips 201, 202, and 203. The first lower pad 210 may be exposed on one side edge (e.g., a left side edge) at the top surface of each of the first lower semiconductor chips 201, 202, and 203. The first lower semiconductor chips 201, 202, and 203 may be stacked in a cascade formation to expose the first lower pads 210. For example, the first lower stack 200 may have a cascade structure that ascends in the first direction D1.

The second lower pad 310 may be disposed on a top surface of each of the second lower semiconductor chips 301, 302, and 303. The second lower pad 310 may be exposed on one side edge (e.g., a left side edge) at the top surface of each of the second lower semiconductor chips 301, 302, and 303. The second lower semiconductor chips 301, 302, and 303 may be stacked in a cascade formation to expose the second lower pads 310. For example, the second lower stack 300 may have a cascade structure that ascends in the first direction D1.

The redistribution substrate 500 may be provided on the first lower stack 200, the second lower stack 300, and the controller 900. The redistribution substrate 500 may be supported by the first lower stack 200 and the second lower stack 300. The first upper stack 600, the second upper stack 700, and the third upper stack 800 may be disposed on the redistribution substrate 500. The molding layer 170 may be disposed on the substrate 100. A description of the substrate 100, the redistribution substrate 500, the first upper stack 600, the second upper stack 700, the third upper stack 800, the controller 900, and the molding layer 170 may be the same as or substantially similar to that discussed above with reference to FIGS. 8 and 9.

Figure 11:
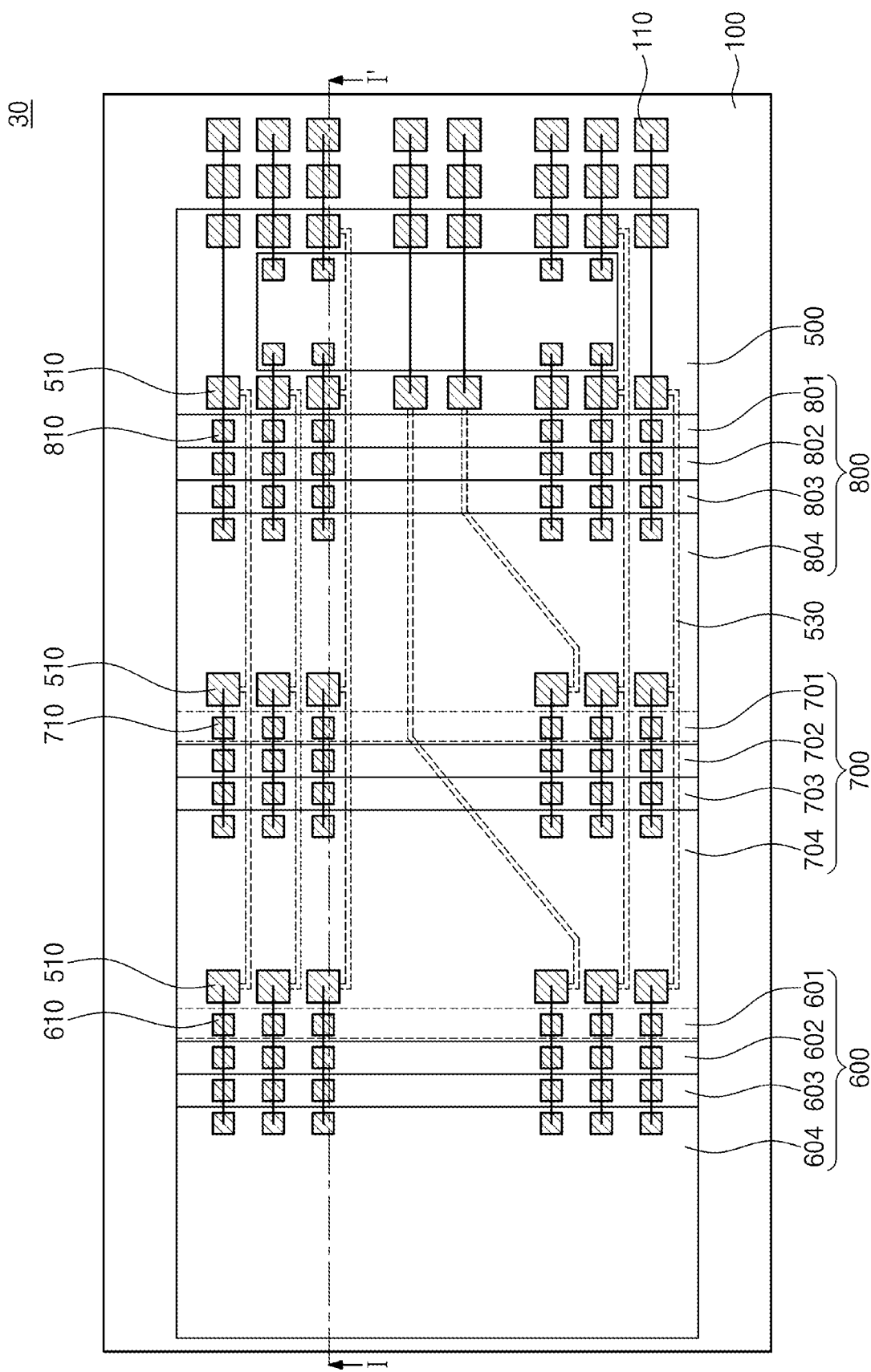
FIG. 11 illustrates a plan view showing a semiconductor package according to some example embodiments of the present inventive concepts.
Figure 12:
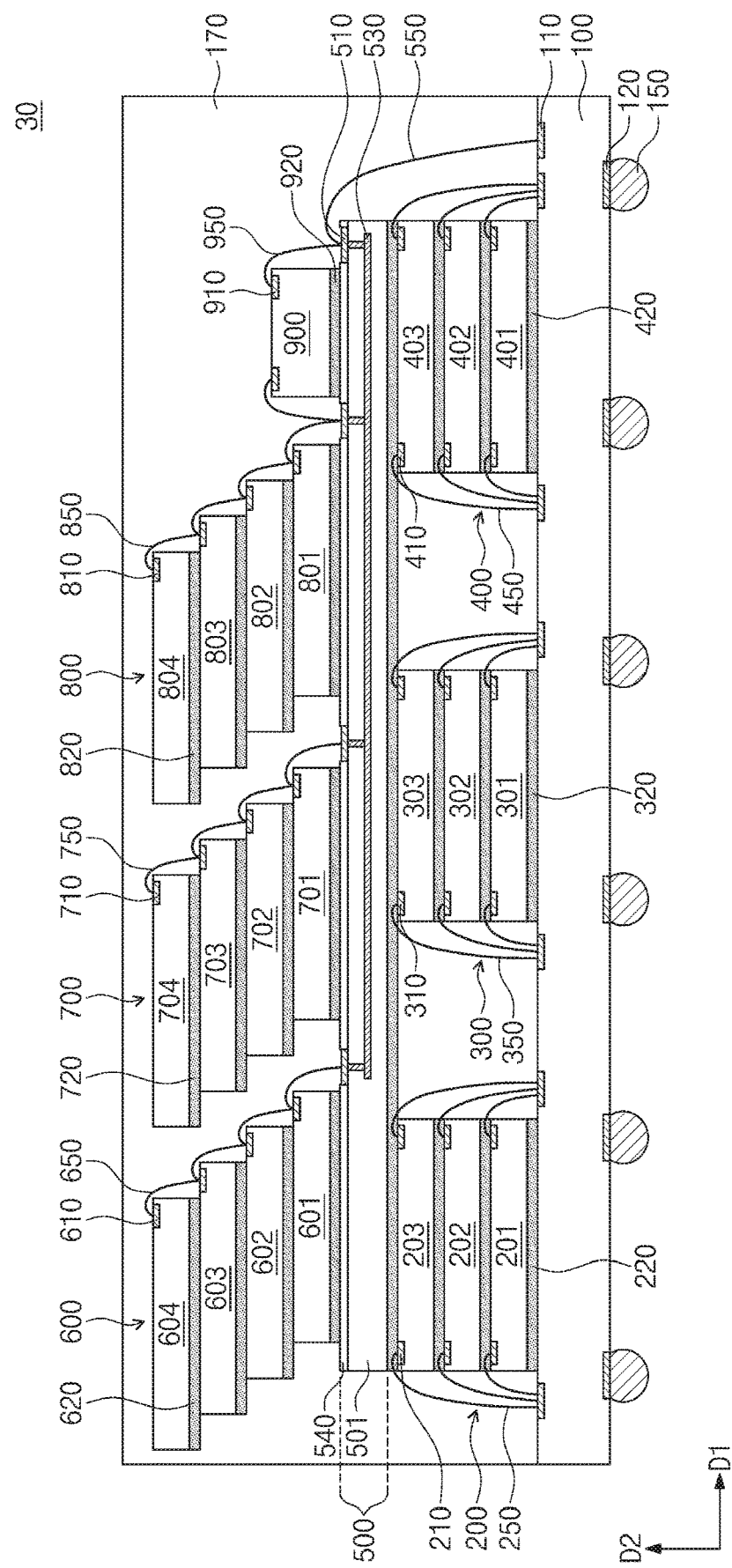
FIG. 12 illustrates a cross-sectional view taken along line I-I' of FIG. 11.

FIG. 11 illustrates a plan view showing a semiconductor package according to some example embodiments of the present inventive concepts. FIG. 12 illustrates a cross-sectional view taken along line I-I' of FIG. 11. A duplicate description will be omitted below.

Referring to FIGS. 11 and 12, a semiconductor package 30 may include the substrate 100, the first lower stack 200, the second lower stack 300, the controller 900, the redistribution substrate 500, the first upper stack 600, the second upper stack 700, the third upper stack 800, and the molding layer 170, and may further include a third lower stack 400.

The first lower stack 200, the second lower stack 300, and the third lower stack 400 may be disposed on the substrate 100. The third lower stack 400 may be spaced apart horizontally (e.g., in the first direction D1) from the first lower stack 200 across the second lower stack 300. The third lower stack 400 may include a plurality of third lower semiconductor chips 401, 402, and 403. The third lower semiconductor chips 401, 402, and 403 may be stacked vertically (e.g., in the second direction D2). The third lower semiconductor chips 401, 402, and 403 may be memory chips or volatile memory chips, such as dynamic random access memory (DRAM). Each of the third lower semiconductor chips 401, 402, and 403 may include a third lower pad 410. The third lower pad 410 may be disposed on a top surface of each of the third lower semiconductor chips 401, 402, and 403. The third lower pad 410 may be provided in plural. The third lower pad 410 may include, for example, at least one metal selected from copper (Cu), aluminum (Al), tungsten (W), and titanium (Ti).

The third lower stack 400 and the substrate 100 may be electrically connected to each other through a third lower connector 450. The third lower connector 450 may be coupled to the third lower pad 410 and the substrate pad 110. Therefore, the third lower semiconductor chips 401, 402, and 403 may be electrically connected to the substrate 100. The third lower connector 450 may be, for example, a bonding wire.

A third lower adhesive layer 420 may be interposed between the third lower semiconductor chips 401, 402, and 403 and between the substrate 100 and a lowermost one 401 of the third lower semiconductor chips 401, 402, and 403. The third lower adhesive layer 420 may include a dielectric polymer.

The redistribution substrate 500 may be disposed on the first lower stack 200, the second lower stack 300, and the third lower stack 400. The redistribution substrate 500 may be provided thereon with the first upper stack 600, the second upper stack 700, the third upper stack 800, and the controller 900. The controller 900 may be spaced apart horizontally (e.g., in the first direction D1) from the second upper stack 700 across the third upper stack 800. The controller 900 and the redistribution substrate 500 may be electrically connected to each other through the chip connector 950. The chip connector 950 may be coupled to the chip pad 910 and the redistribution pad 510. The controller 900 may be electrically connected through the chip connector 950 to one of the first upper stack 600, the second upper stack 700, and the third upper stack 800. A description of the substrate 100, the first lower stack 200, the second lower stack 300, the redistribution substrate 500, the first upper stack 600, the second upper stack 700, and the third upper stack 800 may be the same as or substantially similar to that discussed above with reference to FIGS. 8 and 9.

The molding layer 170 may be provided on the substrate 100. The molding layer 170 may cover the first lower stack 200, the second lower stack 300, the third lower stack 400, the redistribution substrate 500, the first upper stack 600, the second upper stack 700, the third upper stack 800, and the controller 900.

According to the present inventive concepts, because the first, second, and third lower stacks 200, 300, and 400 are disposed on the substrate 100, and because the first, second, and third upper stacks 600, 700, and 800 and the controller 900 are disposed on the redistribution substrate 500, the semiconductor package 30 may have high integration and a compact size.

Figure 13:
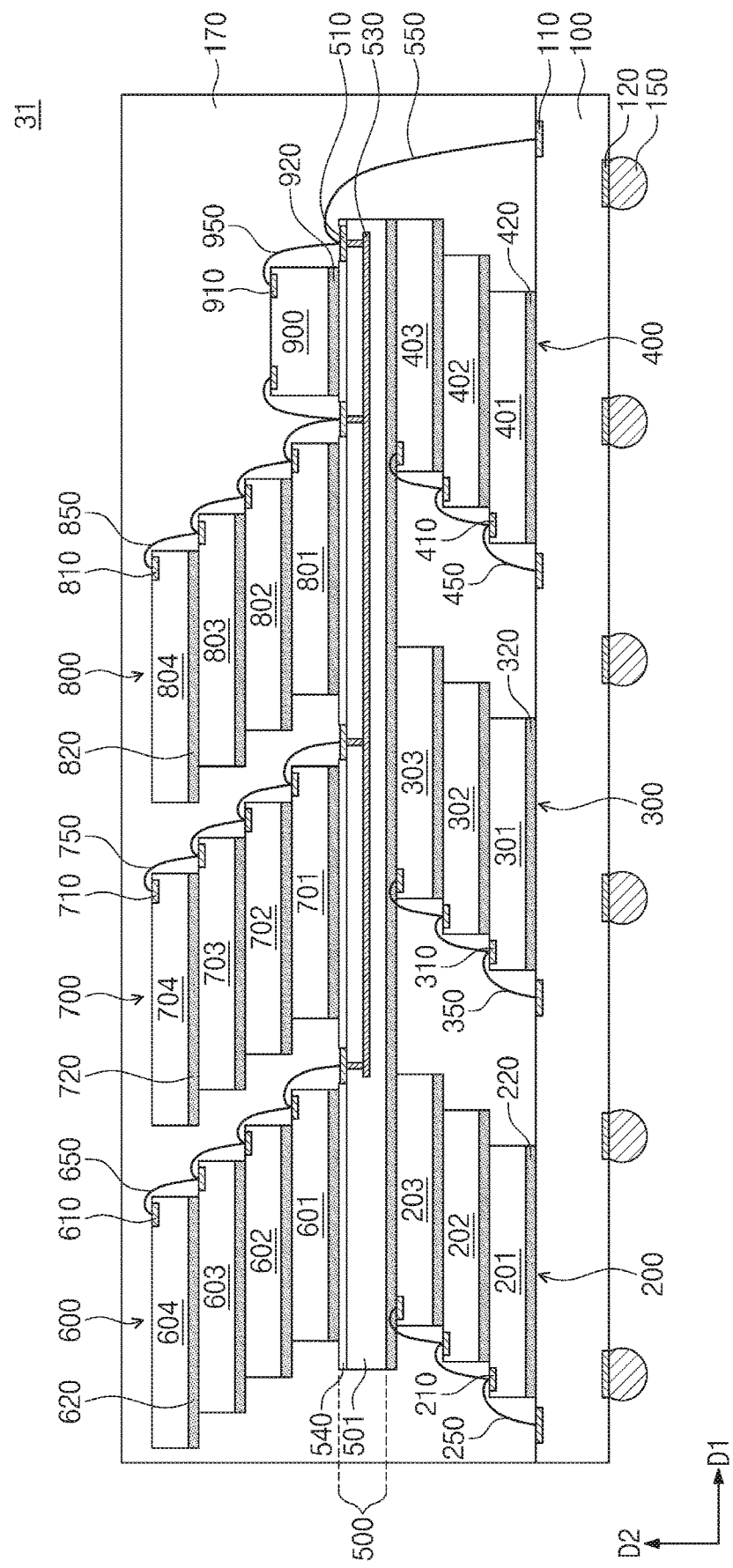
FIG. 13 illustrates a cross-sectional view showing a semiconductor package according to some example embodiments of the present inventive concepts.

FIG. 13 illustrates a cross-sectional view showing a semiconductor package according to some example embodiments of the present inventive concepts. FIG. 13 corresponds to a cross-section taken along line I-I' of FIG. 11. A duplicate description will be omitted below.

Referring to FIGS. 11 and 13, a semiconductor package 31 may include the substrate 100, the first lower stack 200, the second lower stack 300, the third lower stack 400, the controller 900, the redistribution substrate 500, the first upper stack 600, the second upper stack 700, the third upper stack 800, and the molding layer 170.

The first lower stack 200, the second lower stack 300, and the third lower stack 400 may be disposed on the substrate 100. The first lower pad 210 may be disposed on a top surface of each of the first lower semiconductor chips 201, 202, and 203. The first lower pad 210 may be exposed on one side edge (e.g., a left side edge) at the top surface of each of the first lower semiconductor chips 201, 202, and 203. The first lower semiconductor chips 201, 202, and 203 may be stacked in a cascade formation to expose the first lower pads 210. For example, the second lower stack 300 may have a cascade structure that ascends in the first direction D1.

The second lower pad 310 may be disposed on a top surface of each of the second lower semiconductor chips 301, 302, and 303. The second lower pad 310 may be exposed on one side edge (e.g., a left side edge) at the top surface of each of the second lower semiconductor chips 301, 302, and 303. The second lower semiconductor chips 301, 302, and 303 may be stacked in a cascade formation to expose the second lower pads 310. For example, the second lower stack 300 may have a cascade structure that ascends in the first direction D1.

The third lower pad 410 may be disposed on a top surface of each of the third lower semiconductor chips 401, 402, and 403. The third lower pad 410 may be exposed on one side edge (e.g., a left side edge) at the top surface of each of the third lower semiconductor chips 401, 402, and 403. The third lower semiconductor chips 401, 402, and 403 may be stacked in a cascade formation to expose the third lower pads 410. For example, the third lower stack 400 may have a cascade structure that ascends in the first direction D1.

The redistribution substrate 500 may be disposed on the first lower stack 200, the second lower stack 300, and the third lower stack 400. The redistribution substrate 500 may be supported by the first lower stack 200, the second lower stack 300, and the third lower stack 400. The redistribution substrate 500 may be provided thereon with the first upper stack 600, the second upper stack 700, the third upper stack 800, and the controller 900. The molding layer 170 may be disposed on the substrate 100. A description of the substrate 100, the redistribution substrate 500, the first upper stack 600, the second upper stack 700, the third upper stack 800, the controller 900, and the molding layer 170 may be the same as or substantially similar to that discussed above with reference to FIGS. 11 and 12.

Figure 14:
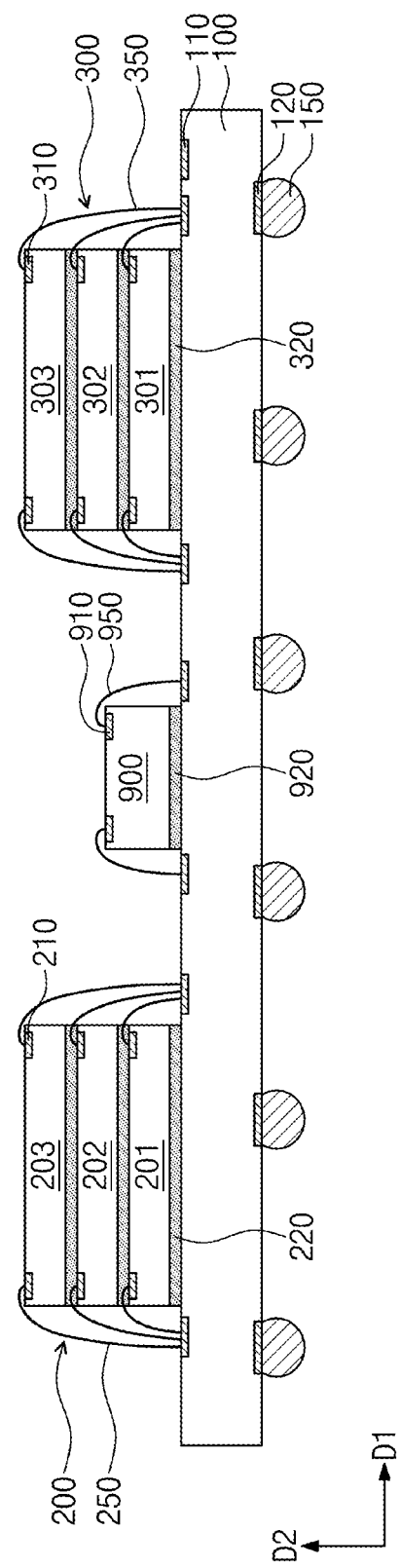
FIGS. 14 and 15 illustrate cross-sectional views showing a method of fabricating a semiconductor package according to some example embodiments of the present inventive concepts.
Figure 15:
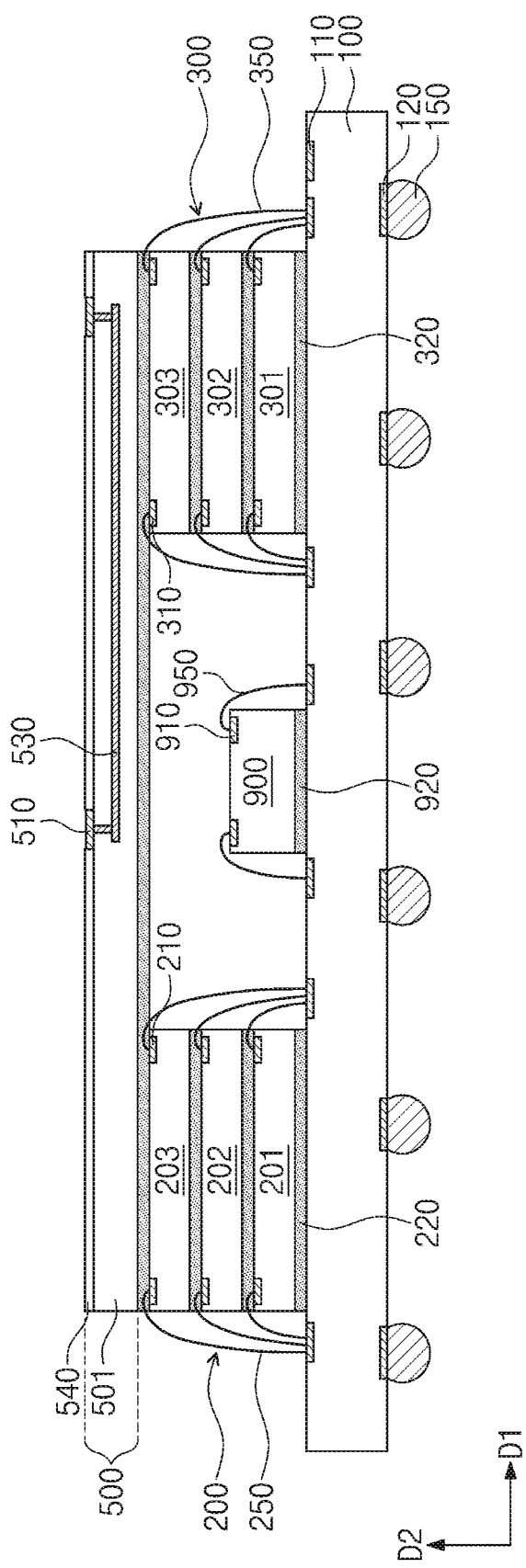

FIGS. 14 and 15 illustrate cross-sectional views showing a method of fabricating a semiconductor package according to some example embodiments of the present inventive concepts.

Referring to FIG. 14, a substrate 100 may be provided. A terminal pad 120 and an external terminal 150 may be provided on a bottom surface of the substrate 100. A substrate pad 110 may be provided on a top surface of the substrate 100. A first lower stack 200, a second lower stack 300, and a controller 900 may be formed on the substrate 100. The controller 900 may be attached to the substrate 100 through a chip adhesive layer 920 formed on a bottom surface of the controller 900. A chip pad 910 may be provided which is formed on a top surface of the controller 900. A chip connector 950 may be formed to electrically connect the chip pad 910 to the substrate pad 110.

The formation of the first lower stack 200 may include forming a plurality of first lower semiconductor chips 201, 202, and 203 on the substrate 100. A lowermost one 201 of the first lower semiconductor chips 201, 202, and 203 may be attached to the substrate 100 through a first lower adhesive layer 220 formed on a bottom surface of the lowermost first lower semiconductor chip 201. The first lower semiconductor chips 202 and 203 may be stacked vertically (e.g., in a second direction D2) on the lowermost first lower semiconductor chip 201. For example, the process mentioned above may be repeatedly performed to form the first lower semiconductor chips 202 and 203. A first lower pad 210 may be provided which is formed on a top surface of each of the first lower semiconductor chips 201, 202, and 203. A first lower connector 250 may be formed to electrically connect the first lower pad 210 to the substrate pad 110.

The formation of the second lower stack 300 may include forming a plurality of second lower semiconductor chips 301, 302, and 303 on the substrate 100. A lowermost one 301 of the second lower semiconductor chips 301, 302, and 303 may be attached to the substrate 100 through a second lower adhesive layer 320 formed on a bottom surface of the lowermost second lower semiconductor chip 301. The second lower semiconductor chips 302 and 303 may be stacked vertically (e.g., in the second direction D2) on the lowermost second lower semiconductor chip 301. For example, the process mentioned above may be repeatedly performed to form the second lower semiconductor chips 302 and 303. A second lower pad 310 may be formed on a top surface of each of the second lower semiconductor chips 301, 302, and 303. A second lower connector 350 may be formed to electrically connect the second lower pad 310 to the substrate pad 110.

Referring to FIG. 15, a redistribution substrate 500 may be formed on the first lower stack 200, the controller 900, and the second lower stack 300. The redistribution substrate 500 may be supported by the first lower stack 200 and the second lower stack 300. A dielectric layer 501 and a redistribution pattern 530 may be provided in the redistribution substrate 500. A redistribution pad 510 and a passivation layer 540 may be provided on a top surface of the redistribution substrate 500.

Referring back to FIG. 2, a first upper stack 600 and a second upper stack 700 may be formed on the redistribution substrate 500. The formation of the first upper stack 600 may include forming a plurality of first upper semiconductor chips 601, 602, 603, and 604 on the redistribution substrate 500. A lowermost one 601 of the first upper semiconductor chips 601, 602, 603, and 604 may be attached to the redistribution substrate 500 through a first upper adhesive layer 620 formed on a bottom surface of the lowermost first upper semiconductor chip 601. The first upper semiconductor chips 602, 603, and 604 may be stacked in a cascade formation on the lowermost first upper semiconductor chip 601. A first upper pad 610 may be provided on a top surface of each of the first upper semiconductor chips 601, 602, 603, and 604. The first upper semiconductor chips 601, 602, 603, and 604 may be formed such that the first upper pad 610 may be exposed on one side edge (e.g., a right side edge) at the top surface of each of the first upper semiconductor chips 601, 602, 603, and 604. For example, the first upper stack 600 may be formed to have a cascade structure that descends in a first direction D1. The first upper stack 600 may be attached to the redistribution substrate 500 through a first upper adhesive layer 620 formed between the first upper semiconductor chips 601, 602, 603, and 604. A first upper connector 650 may be formed to electrically connect the first upper pad 610 to the redistribution pad 510.

The formation of the second upper stack 700 may include forming a plurality of second upper semiconductor chips 701, 702, 703, and 704 on the redistribution substrate 500. A lowermost one 701 of the second upper semiconductor chips 701, 702, 703, and 704 may be attached to the redistribution substrate 500 through a second upper adhesive layer 720 formed on a bottom surface of the lowermost second upper semiconductor chip 701. The second upper semiconductor chips 702, 703, and 704 may be stacked in a cascade formation on the lowermost second upper semiconductor chip 701. A second upper pad 710 may be provided on a top surface of each of the second upper semiconductor chips 701, 702, 703, and 704. The second upper semiconductor chips 701, 702, 703, and 704 may be formed such that the second upper pad 710 may be exposed on one side edge (e.g., a right side edge) at the top surface of each of the second upper semiconductor chips 701, 702, 703, and 704. For example, the second upper stack 700 may be formed to have a cascade structure that descends in the first direction D1. The second upper stack 700 may be attached to the redistribution substrate 500 through a second upper adhesive layer 720 formed between the second upper semiconductor chips 701, 702, 703, and 704. A second upper connector 750 may be formed to electrically connect the second upper pad 710 to the redistribution pad 510. A molding layer 170 may be formed on the substrate 100, thereby covering the first upper stack 600 and the second upper stack 700.

According to the present inventive concepts, because a bonding wire is disposed on or along one lateral surface of an upper chip stack, a length of a redistribution pattern may be reduced or minimized to increase speed and stability of signal transmission. Accordingly, a semiconductor package may improve in electrical characteristics.

According to the present inventive concepts, because a redistribution substrate is disposed on a lower chip stack, it may be possible to reduce complexity of bonding wires connected a substrate and of wiring lines in the substrate. Thus, the substrate may decrease in thickness. Further, because a plurality of upper chip stacks are disposed on the redistribution substrate, the semiconductor package may have high integration and a compact size.

Furthermore, a stress may be reduced at an interface between a molding layer and the upper stacks. Accordingly, delamination of an uppermost semiconductor chip may be mitigated or prevented in a reflow procedure after moisture absorption.

Although the present inventive concepts have been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A semiconductor package, comprising:
a substrate;
a first lower stack on the substrate, the first lower stack including a plurality of first lower semiconductor chips stacked on each other;
a redistribution substrate on the first lower stack;
a redistribution connector on the substrate, the redistribution connector electrically connecting the substrate to the redistribution substrate;
a first upper stack on the redistribution substrate, the first upper stack including a plurality of first upper semiconductor chips stacked in a cascade formation;
a first upper connector on the redistribution substrate, the first upper connector electrically connecting the redistribution substrate to the first upper stack;
a second upper stack on the redistribution substrate and horizontally spaced apart from the first upper stack, the second upper stack including a plurality of second upper semiconductor chips stacked in a cascade formation; and
a second upper connector on the redistribution substrate, the second upper connector electrically connecting the redistribution substrate to the second upper stack,
wherein the redistribution connector is on one side edge at a top surface of the redistribution substrate, the top surface of the redistribution substrate being a surface on which the first upper stack and the second upper stack are provided,
wherein the first upper connector is on one side edge at a top surface of the first upper stack, and
wherein the second upper connector is on one side edge at a top surface of the second upper stack.

2. The semiconductor package of claim 1, further comprising:
a controller on the substrate and horizontally spaced apart from the first lower stack.

3. The semiconductor package of claim 1, wherein each of the redistribution connector, the first upper connector, and the second upper connector includes a bonding wire.

4. The semiconductor package of claim 1, further comprising:
a molding layer on the substrate, the molding layer covering the redistribution substrate, the first upper stack, and the second upper stack.

5. The semiconductor package of claim 1, further comprising:
a controller on the substrate and horizontally spaced apart from the first lower stack; and
a second lower stack on the substrate, the second lower stack including a plurality of second lower semiconductor chips stacked on each other,
wherein the second lower stack is horizontally spaced apart from the first lower stack across the controller.

6. The semiconductor package of claim 1, further comprising:
a third upper stack on the redistribution substrate, the third upper stack including a plurality of third upper semiconductor chips stacked in a cascade formation,
wherein the third upper stack is horizontally spaced apart from the first upper stack across the second upper stack.

7. The semiconductor package of claim 1, further comprising:
a third upper stack on the redistribution substrate, the third upper stack including a plurality of third upper semiconductor chips stacked in a cascade formation; and
a controller on the redistribution substrate and horizontally spaced apart from the second upper stack across the third upper stack.

8. The semiconductor package of claim 1, wherein
the redistribution substrate includes a redistribution pattern, and the redistribution pattern is electrically connected to the first upper connector and the second upper connector.

9. A semiconductor package, comprising:
a substrate including a substrate pad;
a first lower stack on the substrate, the first lower stack including a plurality of first lower semiconductor chips stacked on each other;
a redistribution substrate on the first lower stack, the redistribution substrate including at least one redistribution pad;
a first upper stack on the redistribution substrate, the first upper stack including a plurality of first upper semiconductor chips stacked in a cascade formation, each of the first upper semiconductor chips including a first upper pad exposed on one side edge at a top surface thereof;
a second upper stack on the redistribution substrate and horizontally spaced apart from the first upper stack, the second upper stack including a plurality of second upper semiconductor chips stacked in a cascade formation, each of the second upper semiconductor chips including a second upper pad exposed on one side edge at a top surface thereof;
a first upper connector electrically connecting the first upper pad to the redistribution substrate; and
a second upper connector electrically connecting the second upper pad to the redistribution substrate,
wherein the at least one redistribution pad is on a top surface of the redistribution substrate, the top surface of the redistribution substrate being a surface on which the first upper stack and the second upper stack are provided.

10. The semiconductor package of claim 9, further comprising:
a redistribution connector electrically connecting the substrate pad to the redistribution substrate,
wherein the redistribution connector lies on the substrate and extends toward one side edge at the top surface of the redistribution substrate.

11. The semiconductor package of claim 9, wherein
the first upper connector lies on the redistribution substrate and extends along one lateral surface of the first upper stack, and
the second upper connector lies on the redistribution substrate and extends along one lateral surface of the second upper stack.

12. The semiconductor package of claim 9, wherein
the first upper connector is coupled to the first upper pad, and
the second upper connector is coupled to the second upper pad.

13. The semiconductor package of claim 9, further comprising:
a second lower stack on the substrate, the second lower stack including a plurality of second lower semiconductor chips stacked on each other,
wherein the first lower semiconductor chips are vertically stacked, and
wherein the second lower semiconductor chips are vertically stacked.

14. The semiconductor package of claim 9, further comprising:
a second lower stack on the substrate, the second lower stack including a plurality of second lower semiconductor chips stacked on each other,
wherein the first lower semiconductor chips are stacked in a cascade formation, and
wherein the second lower semiconductor chips are stacked in a cascade formation.

15. The semiconductor package of claim 9, further comprising:
a controller on the substrate and horizontally spaced apart from the first lower stack.

16. The semiconductor package of claim 9, wherein
the redistribution substrate includes a dielectric layer and a passivation layer on the dielectric layer,
the passivation layer exposes the at least one redistribution pad.

17. The semiconductor package of claim 9, wherein
the redistribution substrate includes a redistribution pattern,
the at least one redistribution pad includes a plurality of redistribution pads,
a portion of the redistribution pads is electrically connected to the first upper connector,
another portion of the redistribution pads is electrically connected to the second upper connector, and
the redistribution pattern is coupled to the redistribution pads.

18. A semiconductor package, comprising:
a substrate;
a first lower stack on the substrate, the first lower stack including a plurality of first lower semiconductor chips stacked on each other;
a controller on the substrate and horizontally spaced apart from the first lower stack;
a second lower stack on the substrate and horizontally spaced apart from the first lower stack across the controller;
a redistribution substrate on the first lower stack, the controller, and the second lower stack, the redistribution substrate including a redistribution pattern;
a redistribution adhesive layer between a bottom surface of the redistribution substrate and the first and second lower stacks;
a redistribution connector on the substrate, the redistribution connector electrically connecting the substrate to the redistribution substrate;
a first upper stack on the redistribution substrate, the first upper stack including a plurality of first upper semiconductor chips stacked in a cascade formation;
a first upper connector on the redistribution substrate, the first upper connector electrically connecting the redistribution substrate to the first upper semiconductor chips;
a second upper stack on the redistribution substrate and horizontally spaced apart from the first upper stack, the second upper stack including a plurality of second upper semiconductor chips stacked in a cascade formation;
a second upper connector on the redistribution substrate, the second upper connector electrically connecting the redistribution substrate to the second upper semiconductor chips; and
a molding layer on the substrate, the molding layer covering the redistribution substrate, the first upper stack, and the second upper stack.

19. The semiconductor package of claim 18, further comprising:
a third upper stack on the redistribution substrate, the third upper stack including a plurality of third upper semiconductor chips stacked in a cascade formation; and
a third upper connector on the redistribution substrate, the third upper connector electrically connecting the redistribution substrate to the third upper semiconductor chips,
wherein the third upper stack is horizontally spaced apart from the first upper stack across the second upper stack, and
wherein the redistribution pattern is electrically connected to the first, second, and third upper connectors.

20. The semiconductor package of claim 18, further comprising:
a first upper adhesive layer between the redistribution substrate and a lowermost one of the first upper semiconductor chips and between the first upper semiconductor chips; and
a second upper adhesive layer between the redistribution substrate and a lowermost one of the second upper semiconductor chips and between the second upper semiconductor chips.

* * * * *